US010431686B1

United States Patent
Yang et al.

(10) Patent No.: US 10,431,686 B1
(45) Date of Patent: Oct. 1, 2019

(54) INTEGRATED CIRCUIT (IC) EMPLOYING A CHANNEL STRUCTURE LAYOUT HAVING AN ACTIVE SEMICONDUCTOR CHANNEL STRUCTURE(S) AND AN ISOLATED NEIGHBORING DUMMY SEMICONDUCTOR CHANNEL STRUCTURE(S) FOR INCREASED UNIFORMITY

(71) Applicant: QUALCOMM Incorporated, San Diego, CA (US)

(72) Inventors: Haining Yang, San Diego, CA (US); Xiangdong Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/126,886

(22) Filed: Sep. 10, 2018

(51) Int. Cl.
  *H01L 29/78* (2006.01)
  *H01L 21/8234* (2006.01)
  *H01L 27/088* (2006.01)
  *H01L 29/66* (2006.01)

(52) U.S. Cl.
  CPC .. *H01L 29/7851* (2013.01); *H01L 21/823412* (2013.01); *H01L 21/823431* (2013.01); *H01L 27/0886* (2013.01); *H01L 29/6681* (2013.01)

(58) Field of Classification Search
  None
  See application file for complete search history.

(56) References Cited

U.S. PATENT DOCUMENTS

| | | | | |
|---|---|---|---|---|
| 7,858,415 B2 * | 12/2010 | Saito | ............... | H01L 27/1285 257/E21.414 |
| 7,915,108 B2 * | 3/2011 | Jang | ............... | H01L 21/823412 438/197 |
| 8,283,218 B2 * | 10/2012 | Saito | ............... | H01L 27/1285 257/E21.177 |
| 8,653,560 B2 * | 2/2014 | Tatsumura | ............... | H01L 29/045 257/192 |
| 8,669,775 B2 * | 3/2014 | Choi | ............... | H01L 22/34 324/762.01 |
| 9,196,677 B2 * | 11/2015 | Liu | ............... | H01L 29/66795 |
| 9,293,466 B2 * | 3/2016 | Liaw | ............... | H01L 27/1104 |
| 9,425,208 B2 * | 8/2016 | Kim | ............... | H01L 27/11582 |
| 9,460,805 B1 * | 10/2016 | Pang | ............... | G11C 16/0483 |

(Continued)

*Primary Examiner* — David E Graybill
(74) *Attorney, Agent, or Firm* — W&T/Qualcomm

(57) ABSTRACT

An integrated circuit (IC) employs a channel structure layout having an active semiconductor channel structure(s) and an isolated neighboring dummy semiconductor channel structure(s) for increased uniformity. A semiconductor channel structure(s) in an IC is a fin structure(s) or a gate-all-around (GAA) structure(s) employed in a Field-Effect Transistor (FET), such as a FinFET or a three-dimensional (3D) FET. The channel structures in the IC are fabricated according to a circuit cell architecture, such as a standard circuit cell ("standard cell"). The IC includes an active (e.g., diffusion) region in which a semiconductor channel structure array (e.g., semiconductor fin array) is formed according to a pattern. The IC includes a device employing a channel structure array in the active region. The channel structure array may include one active channel structure (e.g., fin) for reduced power consumption in the FinFET, and may include at least one dummy fin for increased uniformity.

28 Claims, 14 Drawing Sheets

(56) References Cited

U.S. PATENT DOCUMENTS

| | | | | |
|---|---|---|---|---|
| 9,495,903 B2* | 11/2016 | Kwon | | G09G 3/3225 |
| 9,634,026 B1* | 4/2017 | Sahu | | H01L 27/11807 |
| 9,646,984 B2* | 5/2017 | Kim | | H01L 23/5283 |
| 9,716,104 B2* | 7/2017 | Kim | | H01L 27/11582 |
| 9,786,676 B2* | 10/2017 | Yun | | H01L 23/5226 |
| 9,793,372 B1* | 10/2017 | Smith | | H01L 21/30604 |
| 9,853,049 B2* | 12/2017 | Kim | | H01L 27/11582 |
| 9,887,207 B2* | 2/2018 | Zhang | | H01L 27/11582 |
| 9,929,179 B2* | 3/2018 | Son | | H01L 29/7827 |
| 9,972,636 B2* | 5/2018 | Kim | | H01L 27/11582 |
| 10,043,797 B2* | 8/2018 | Jun | | H01L 21/823487 |
| 10,079,203 B2* | 9/2018 | Son | | H01L 23/5226 |
| 10,141,232 B2* | 11/2018 | Lee | | H01L 21/823885 |
| 10,153,292 B2* | 12/2018 | Kim | | H01L 27/11582 |
| 10,157,996 B2* | 12/2018 | Smith | | H01L 21/30604 |
| 10,170,332 B2* | 1/2019 | Huang | | H01L 29/66795 |
| 10,199,389 B2* | 2/2019 | Kim | | H01L 23/5283 |
| 10,249,636 B2* | 4/2019 | Yun | | H01L 23/5226 |
| 2009/0078937 A1* | 3/2009 | Saito | | H01L 27/1285 257/59 |
| 2011/0042674 A1* | 2/2011 | Saito | | H01L 27/1285 257/57 |
| 2012/0074980 A1* | 3/2012 | Choi | | H01L 22/34 324/762.01 |
| 2012/0139007 A1* | 6/2012 | Tatsumura | | H01L 29/045 257/192 |
| 2012/0208347 A1* | 8/2012 | Hwang | | H01L 27/1157 438/430 |
| 2015/0303214 A1* | 10/2015 | Kim | | H01L 27/11582 257/329 |
| 2015/0380558 A1* | 12/2015 | Huang | | H01L 29/66795 257/288 |
| 2016/0049421 A1* | 2/2016 | Zhang | | H01L 27/11582 257/314 |
| 2016/0064417 A1* | 3/2016 | Ponoth | | H01L 21/76224 257/350 |
| 2016/0140896 A1* | 5/2016 | Kwon | | G09G 3/3225 345/76 |
| 2017/0025412 A1* | 1/2017 | Jun | | H01L 21/823487 |
| 2017/0040337 A1* | 2/2017 | Kim | | H01L 27/11582 |
| 2017/0084532 A1* | 3/2017 | Son | | H01L 23/5226 |
| 2017/0092651 A1* | 3/2017 | Kim | | H01L 23/5283 |
| 2017/0133389 A1* | 5/2017 | Yun | | H01L 23/5226 |
| 2017/0229476 A1* | 8/2017 | Kim | | H01L 23/5283 |
| 2017/0294443 A1* | 10/2017 | Kim | | H01L 27/11582 |
| 2017/0294445 A1* | 10/2017 | Son | | H01L 29/7827 |
| 2017/0309635 A1* | 10/2017 | Kim | | H01L 27/11582 |
| 2017/0345914 A1* | 11/2017 | Smith | | H01L 21/30604 |
| 2017/0365612 A1* | 12/2017 | Yun | | H01L 23/5226 |
| 2018/0005904 A1* | 1/2018 | Lee | | H01L 21/823885 |
| 2018/0190668 A1* | 7/2018 | Kim | | H01L 27/11582 |
| 2018/0191481 A1* | 7/2018 | Son | | H01L 29/7827 |
| 2019/0057867 A1* | 2/2019 | Smith | | H01L 29/66439 |
| 2019/0157282 A1* | 5/2019 | Jung | | H01L 27/11556 |
| 2019/0198511 A1* | 6/2019 | Yun | | H01L 23/5226 |

\* cited by examiner

| PROCESS | FIN CUT FIRST | FIN CUT LAST |
|---|---|---|
| PROS | STI ETCH AFTER DUMMY FIN HARDMASK REMOVAL | DUMMY FIN REMOVAL DURING ETCH |
| | NO GHOST FIN RISK | UNIFORM FIN CD<br>BETTER FIN LEANING |
| CONS | NON-UNIFORM FIN CD<br>WORSE FIN LEANING | WORSE GHOST FIN RISK |

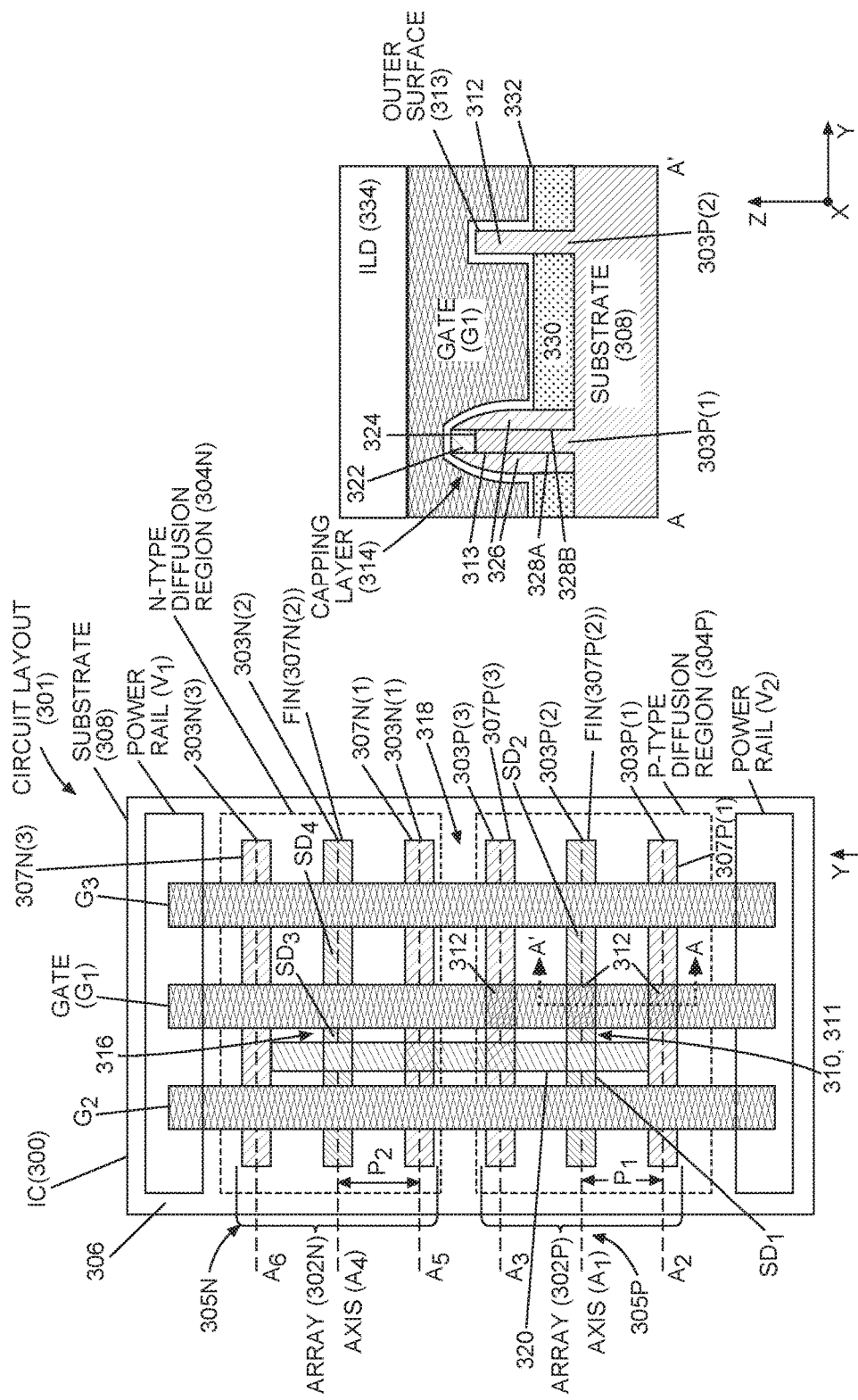

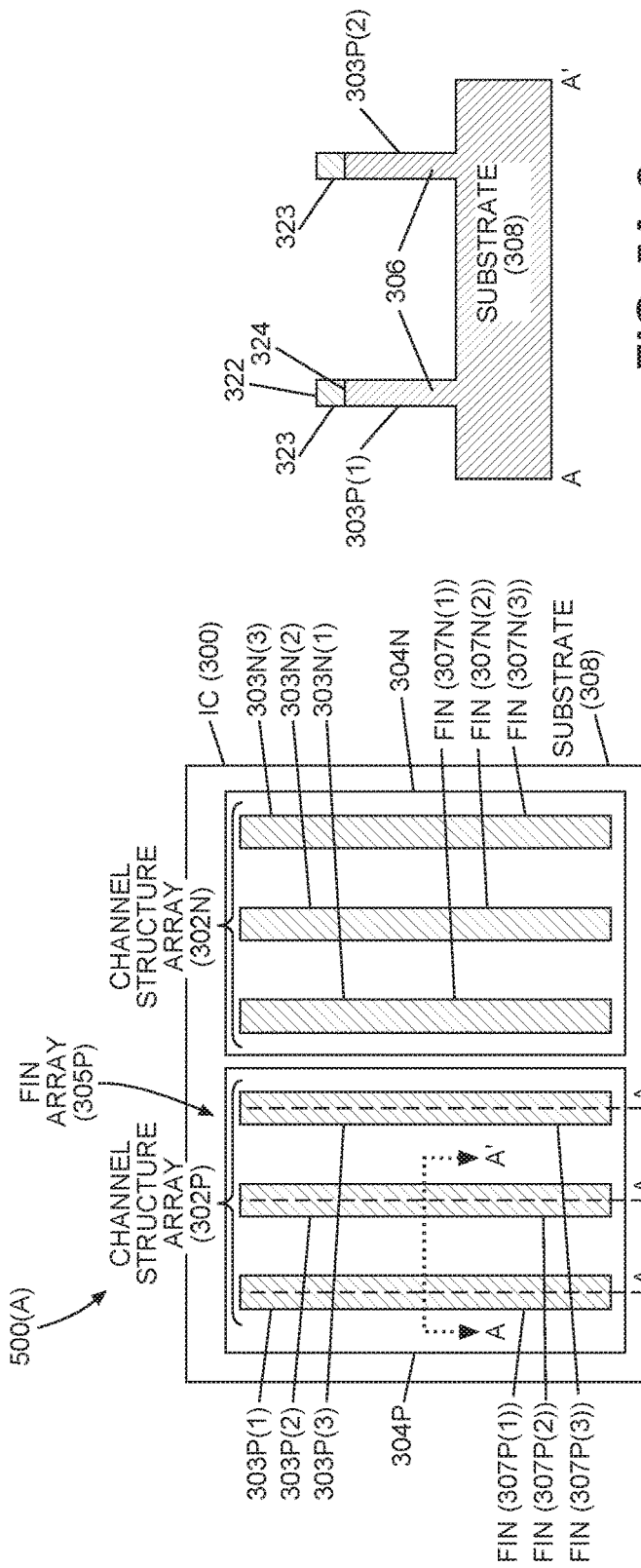

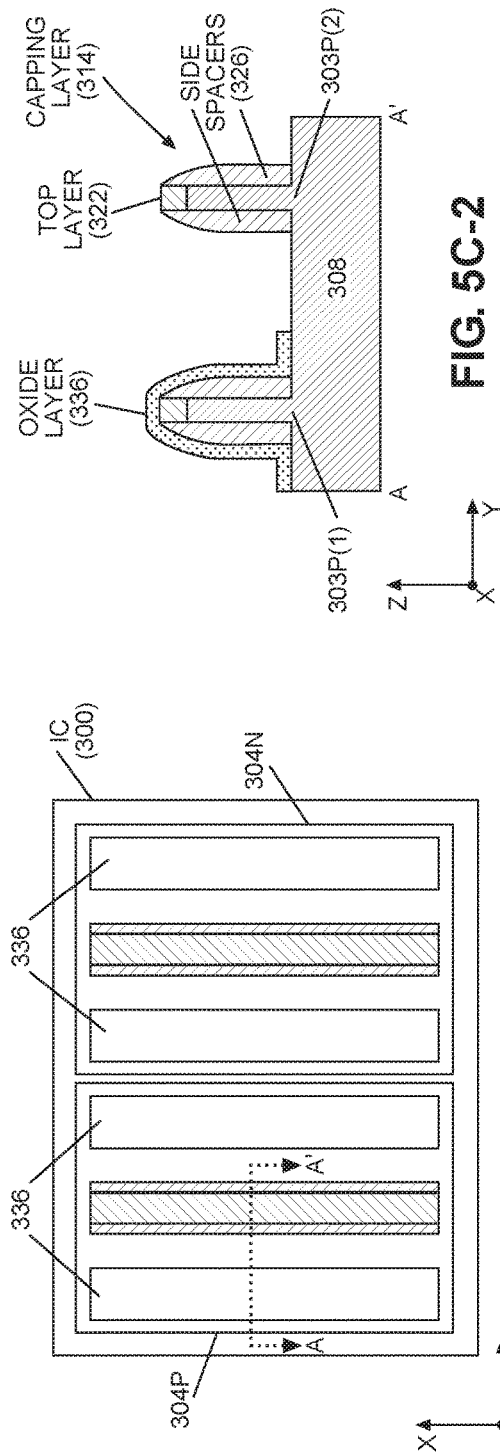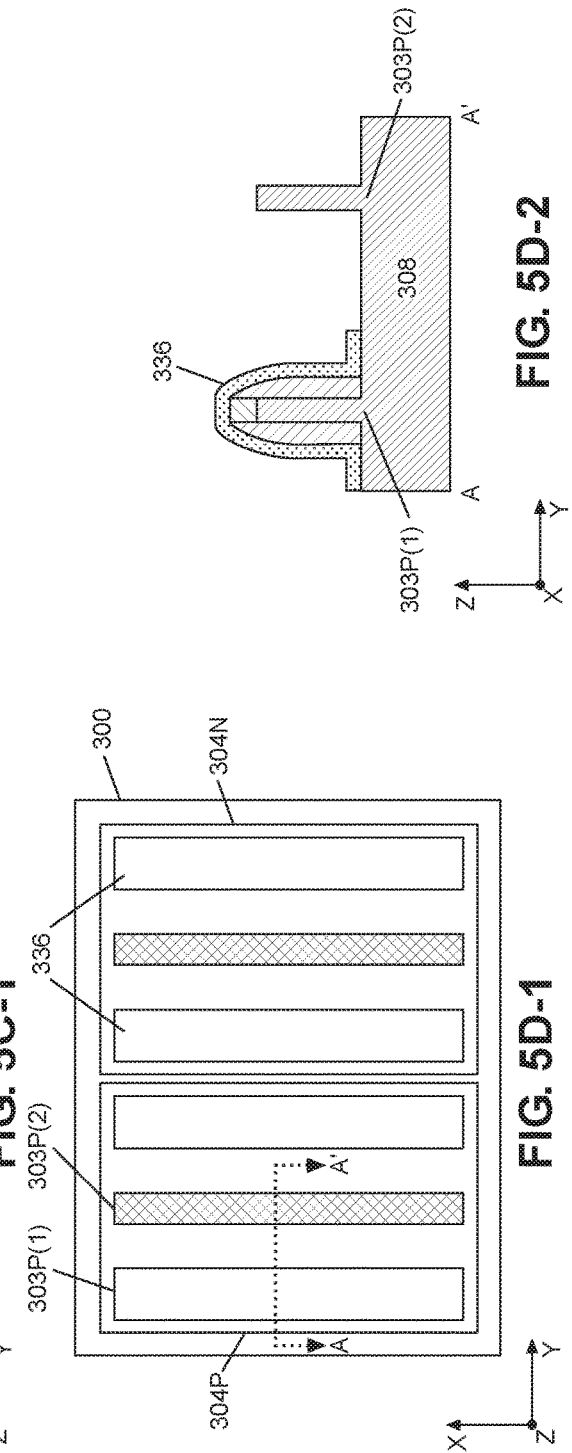

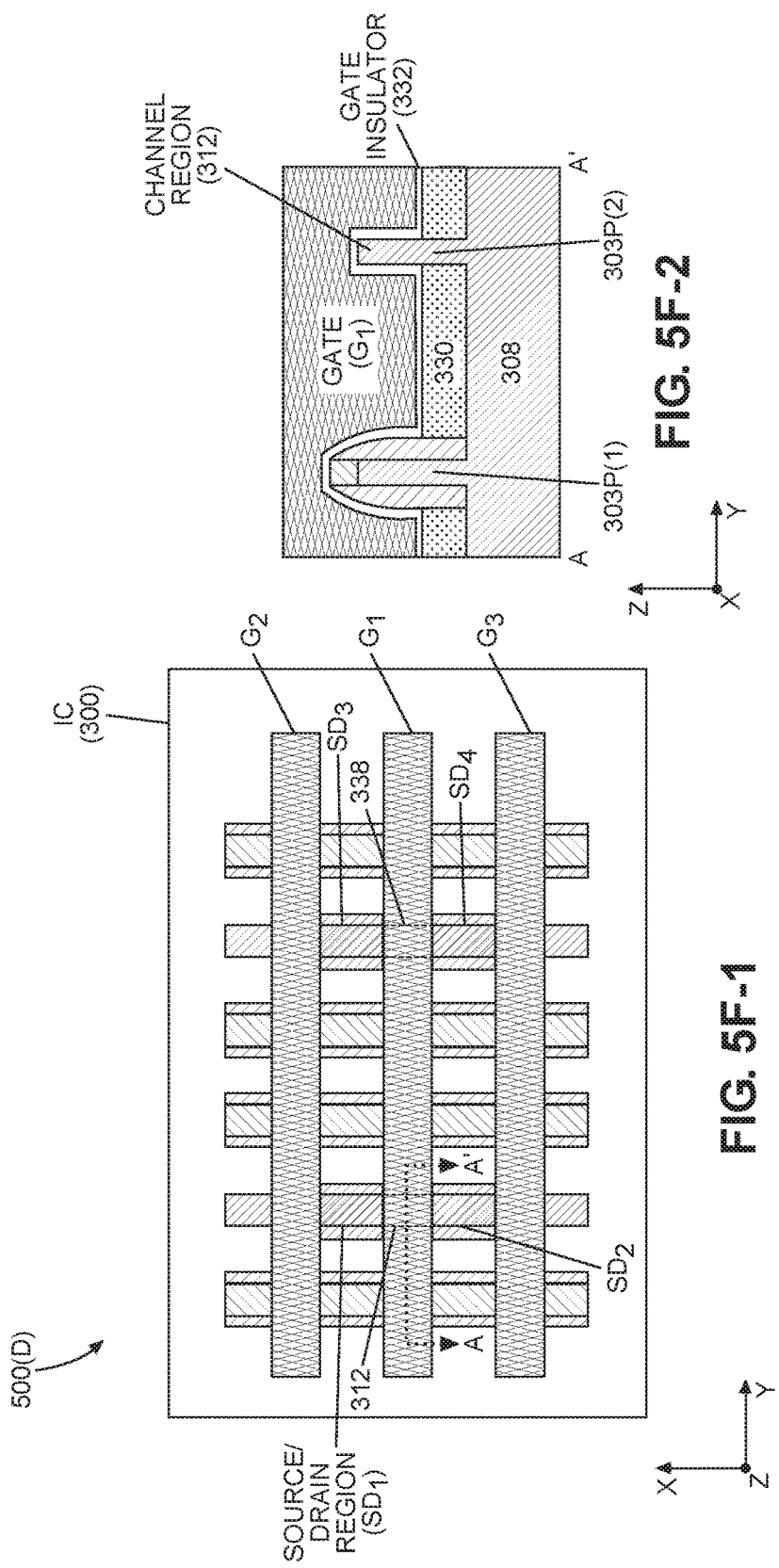

INTEGRATED CIRCUIT (IC) EMPLOYING A CHANNEL STRUCTURE LAYOUT HAVING AN ACTIVE SEMICONDUCTOR CHANNEL STRUCTURE(S) AND AN ISOLATED NEIGHBORING DUMMY SEMICONDUCTOR CHANNEL STRUCTURE(S) FOR INCREASED UNIFORMITY

BACKGROUND

I. Field of the Disclosure

The technology of the disclosure relates generally to integrated circuits (ICs) employing three dimensional (3D) transistors, such as Fin Field-Effect Transistors (FETs) (FinFETs) and gate-all-around (GAA) transistors, and more specifically to channel structures in the ICs used to form semiconductor channels for the 3D transistors.

II. Background

Transistors are essential in components of modern electronic devices. Large numbers of transistors are employed in integrated circuits (ICs) in components such as central processing units (CPUs) and memory systems. With increasing functional complexity of electronic devices, the number of transistors needed in such devices also increases. However, with the demand for electronic devices in smaller packages, such as in mobile devices for example, there is a need to provide a greater number of transistors in a smaller IC chip. This increase in the number of transistors is achieved in part through continued efforts to miniaturize transistors in ICs (i.e., placing increasingly more transistors into the same amount of space). For example, node sizes in ICs have scaled down according to a reduction in minimum metal line width in the ICs (e.g., 65 nanometers (nm), 45 nm, 28 nm, 20 nm, etc.). As a result, transistor gate lengths are also scalably reduced, thereby reducing channel lengths of the transistors. Reduced channel length in planar transistors has the benefit of increasing drive strength (i.e., increased drive current) and providing smaller parasitic capacitances resulting in reduced circuit delay. However, as channel length in planar transistors is further reduced, short channel effects (SCEs) can degrade performance. More specifically, SCEs in planar transistors cause increased current leakage, reduced threshold voltage, and/or threshold voltage roll-off (i.e., reduced threshold voltage at shorter gate lengths), and therefore, reduced gate control.

To overcome SCEs caused by reduced channel lengths in planar transistors, three-dimensional (3D) or "quasi-planar" transistors have been developed. One example of a 3D transistor is a Fin Field-Effect transistor (FET) (FinFET). FinFET transistors include thin silicon (Si) "fins" forming a semiconductor channel structure. A FinFET provides reduced current leakage and increased threshold voltage with increased performance as compared to a planar transistor of a similar footprint. In this regard, FIG. 1 illustrates a conventional metal-oxide semiconductor (MOS) FinFET 100 ("FinFET 100") as an example of a FinFET with a single active fin. FinFETs like the FinFET 100 in FIG. 1 can be employed in complementary MOS (CMOS) circuits. The FinFET 100 includes a substrate 102 and a single fin 104 made of a semiconductor material disposed above the substrate 102. An oxide layer 106 is included on either side of the fin 104. The FinFET 100 includes a "wrap-around" gate 108 disposed on the substrate 102 and over the fin 104 forming a conduction channel 114. A source 110 and a drain 112 are formed in the fin 104 on opposite sides of the gate 108 to provide the source 110 and the drain 112 for the FinFET 100. Metal contacts (not shown) are disposed in contact with the source 110 and the drain 112 to provide respective source and drain contacts. The fin 104 serves as the conduction channel 114 for current flow between the source 110 and the drain 112. The wrap-around structure of the gate 108 provides better electrostatic control over the conduction channel 114, and thus helps to reduce the leakage current and overcome SCEs.

As technology nodes employing FinFETs have decreased in size, such as from 22 nm, 14/16 nm, and 10 nm to 7 nm and smaller, as examples, the number of fins employed in a FinFET has been reduced due to reduction in node area. A reduction in fins in a FinFET reduces the volume of semiconducting material for the channel, thus lowering drive strength (i.e., reduced current flow) unless the fin height is increased to compensate for the reduction in fins. Reducing the number of fins in a FinFET to reduce its drive strength may be desired to reduce power consumption. Reducing the number of active fins in a FinFET may also reduce parasitic capacitance of the FinFET because a reduction in fins generally reduces the volume of the channel structure, and thus parasitic capacitance, between the channel structure and the gate of the FinFET. A reduction in parasitic capacitance can also reduce power consumption according to the power formula $P\text{-}CV^2f$, where V is voltage, f is frequency, and C is capacitance.

Photolithographic methods (e.g., self-aligned double patterning (SADP)), can be employed for fabricating an array structure of fins that can be used to form channel structures of a FinFET, such as the fin 104 in the FinFET 100 in FIG. 1. For example, a circuit may be fabricated in a uniform array structure with a predefined number of fins according to a fin pattern density. The maximum fin pattern density is determined by the minimum spacing between fins and the fin thickness. Together, these parameters determine a "fin pitch." Although some variations in shape among the fins normally occur, even in a highly uniform fin array structure, uniformity of the spacing between fins in the fin array structure minimizes such variations. However, non-uniform spaces are created where fins are not wanted, such as in spaces where isolation regions will ultimately be formed (e.g., a non-diffusion region), or where fins are not needed within a circuit cell layout. Fins that form channel structures for active devices, such as FinFETs in an IC, are fabricated to be active fins, but fins in the array structure that will not be used as active fins (i.e., dummy fins) are removed from the array, or are not created as part of the array. For example, dummy fins immediately neighboring an active fin for a single fin FinFET are removed or excluded. The absence of a fin immediately neighboring the active fin creates a gap that is much larger than the minimum spacing between fins according to the fin pitch.

The results of the etching process for creating a fin array structure vary significantly depending on the spacing (i.e., the gap) between fins. Non-uniformities in the pattern of fins in the fin array produce non-uniformities in the fabricated fin structures, which result in non-uniformities in performance of active device channels formed with the fabricated fin structures. For example, fins having non-uniform critical dimensions, such as fin width, may exhibit different levels of electrostatic control and may have different channel sizes, which may cause FinFETs formed of fins in the same array to have different and unpredictable operating characteristics. In addition, variations in the results of subsequent processing steps, such as forming source/drain regions, may increase in fins having non-uniform structures.

Uniformity of fins formed in an array structure also depends on the process by which the unused fins are excluded or removed. Unused fins in a circuit cell or an isolation region, which may be referred to herein as dummy fins, may be excluded (i.e., not formed) from a fin pattern in a "fin cut first" process, or removed (i.e., after array formation) from the fin array structure in a "fin cut last" process. Dummy fin removal after fin fabrication (e.g., by the "fin cut last" process) is seen as an improvement over excluding fins from the fin pattern, but either process can cause an increase in non-uniformities in fin structure, and both processes can cause increased variations in the subsequent processing steps, which also cause FinFETs to have different operating characteristics.

FIG. 2A illustrates an array 200 in which fins are not formed in fin positions 202 in a "fin cut first" process. Here, two center rows of a hard mask array pattern 204 are removed, leaving a gap 208 that is larger than uniform spacing 210 between other fins in the array 200. Edge fins 212, which are the fins closest to the gap 208, have non-uniform critical dimensions (CDs) (e.g., width) and appear to be leaning due to non-uniform etching. The dynamics of the plasma or chemical etching process in the larger gap 208 may be different than in the uniform spacing 210, causing the etch rate to be different. For example, the densities and/or flow rates of chemicals may be different in the larger gap 208 than in the uniform spacing 210. In addition, build-up of etch residue and/or chemical waste may be deposited on surfaces 214A of the edge fins 212 in the gap 208, causing passivation that slows the etch rate. In the example of FIG. 2A, bases 214B of the edge fins 212 are thicker on one side where the surfaces 214A are etched more slowly, but the edge fins 212 may also become narrower than other fins in the array 200, depending on the etching recipe (i.e., set of processes) employed. The non-uniform fin thickness also causes differences in the formation and operation of source and drain regions of the fin. Due to increased variations in fins formed by the "fin cut first" process, the edge fins 212 may have unpredictable operating characteristics that are different than other fins within the array 200.

FIG. 2B illustrates an array 220 in which two center fins (dummy fins) 222 are removed by a "fin cut last" process. In this process, the array 220 is created as a "sea of fins 224" in which all the fins 224 in the array 220 have uniform critical dimensions and do not appear to be leaning. In this process, no rows are excluded from the hard mask array pattern 204, and hence the hard mask 226 that is used to make the array 220. However, an etching step for removing the two unwanted center fins 222 must be carefully controlled. If a dummy fin is not sufficiently etched away, a part of the dummy fin (i.e., a ghost fin 228) may remain. On the other hand, excessive etching may cause surfaces 230 of edge fins 232 or a substrate 234 to be unintentionally over-etched. Over-etching these surfaces 230 can increase variations in the results of subsequent processing of the edge fins 232, such as creation of source/drain regions. Over-etching may also affect the mechanical stability of the edge fins 232. Due to increased variations in the edge fins 232 formed by the fin cut last process, the edge fins 232 may have unpredictable operating characteristics that are different than other fins within the array 220.

SUMMARY OF THE DISCLOSURE

Aspects disclosed in the detailed description include an integrated circuit (IC) employing a channel structure layout having an active semiconductor channel structure(s) and an isolated neighboring dummy semiconductor channel structure(s). For example, this may provide for improved uniformity in spacing between adjacent channel structures in an IC. A semiconductor channel structure(s) in an IC may be a fin structure(s) or a gate-all-around (GAA) structure(s) employed in a Field-Effect Transistor (FET), such as a FinFET or a three-dimensional (3D) FET as examples. The channel structures formed in the IC may be fabricated according to a circuit cell architecture, such as a standard circuit cell also known as a "standard cell." In exemplary aspects disclosed herein, the IC includes at least one active (e.g., diffusion) region in which an array of semiconductor channel structures (e.g., a semiconductor fin array) may be formed according to a pattern. The IC includes a semiconductor device (e.g., a FinFET) that employs an array of semiconductor channel structures in the active region of the IC. The channel structure array in the active region may include one active semiconductor channel structure (e.g., an active fin) for reduced power consumption in the FinFET, and may include at least one neighboring dummy semiconductor channel structure (e.g., a "dummy fin") for increased uniformity.

In exemplary aspects disclosed herein, a neighboring dummy semiconductor channel structure is not electrically active in the IC, because the neighboring dummy semiconductor channel structure is isolated by a capping layer disposed over an outer surface of the neighboring dummy semiconductor channel structure. The capping layer protects the semiconductor structure of the dummy semiconductor channel structure from processes for forming source/drain regions in the active channel structure, and electrically isolates the dummy semiconductor channel structure from the IC. In contrast, removing an immediately adjacent dummy semiconductor channel structure during fabrication of the active channel structure(s) may create non-uniform spacing (i.e., a gap wider than spacing by a channel structure array pitch) between the active semiconductor channel structure and a nearest adjacent semiconductor channel structure. Non-uniform spacing increases variations in the formation of the active semiconductor channel structure and variations in subsequent processing of the active semiconductor channel structure. Such increased variations lead to unpredictable and non-uniform operating characteristics in the IC.

In this regard, in one exemplary aspect, an IC is disclosed. The IC includes a substrate comprising a diffusion region and a semiconductor channel structure array disposed above the substrate in the diffusion region. The semiconductor channel structure array of the integrated circuit comprises a plurality of channel structures each spaced by a channel structure pitch, and each channel structure among the plurality of channel structures is disposed immediately adjacent to at least one neighboring channel structure among the plurality of channel structures. The plurality of channel structures comprises an active channel structure disposed along a first longitudinal axis, and the active channel structure comprises a channel region of the active channel structure, a first source/drain region disposed at a first end portion of the channel region, a second drain/source region at a second end portion of the channel region. The plurality of channel structures further comprises an isolated neighboring dummy channel structure disposed immediately adjacent to the active channel structure. The isolated neighboring dummy channel structure comprises a second channel structure having an outer surface and disposed along a second longitudinal axis substantially parallel to the first longitudinal axis, and a capping layer disposed on at least a portion of the outer surface of the second channel structure. The integrated circuit also includes a gate disposed around at least a portion of the channel region of the active channel structure.

In another exemplary aspect, a method of fabricating an IC is disclosed. The method comprises forming a semiconductor channel structure array in a diffusion region of a substrate, which further comprises forming a plurality of channel structures above the substrate and spaced by a channel structure pitch, each of the plurality of channel structures disposed immediately adjacent to at least one neighboring channel structure among the plurality of channel structures. Forming the plurality of channel structures comprises forming an active channel structure disposed along a first longitudinal axis, and a neighboring dummy channel structure immediately adjacent to the active channel structure along a second longitudinal axis substantially parallel to the first longitudinal axis. The method of fabricating the integrated circuit further comprises forming a capping layer on an outer surface of the neighboring dummy channel structure to isolate the neighboring dummy channel structure. The method of fabricating the integrated circuit further comprises forming a first source/drain region and a second drain/source region at first and second end portions, respectively, of a channel region in the active channel structure, the capping layer isolating the isolated neighboring dummy channel structure from formation of a source or a drain in the isolated neighboring dummy channel structure. The method of fabricating the integrated circuit further comprises forming a gate over a channel region of each of the plurality of channel structures, including the channel region of the active channel structure.

BRIEF DESCRIPTION OF THE FIGURES

FIGS. 2A and 2B are illustrations of cross-sectional views each showing fin array structures from which two fins have been excluded or removed by conventional "fin cut first" and "fin cut last" processes, respectively;

FIG. 3A is a top-down view of an exemplary integrated circuit (IC) including an array of semiconductor channel structures ("channel structure array") that includes at least one structure having an active channel region subject to control by a gate disposed over the channel structure array, and at least one isolated dummy structure that is immediately neighboring the active structure at a uniform spacing, and is electrically isolated from the IC by a capping layer;

FIG. 3B is a cross-sectional view of a portion of the channel structure array of FIG. 3A, illustrating a top cap and side spacers that form the capping layer on the at least one isolated dummy structure;

FIGS. 5A-1 and 5A-2 are illustrations of a top view and a side cross-sectional view, respectively, of an exemplary fabrication stage of the IC in FIG. 3 illustrating a fin array structure as an example of a channel array structure formed from a substrate, wherein the views show a first exemplary fabrication stage of the IC in FIGS. 3A and 3B, in which a top cap is formed on a top surface of fins in the fin array structure;

FIGS. 5B-1 and 5B-2 are a top view and a side cross-sectional view, respectively, of the exemplary fin array structure of FIGS. 5A-1 and 5A-2 in a second exemplary fabrication stage illustrating side spacers formed on each fin;

FIGS. 5C-1 and 5C-2 are a top view and a side cross-sectional view, respectively, of the exemplary fin array structure of FIGS. 5B-1 and 5B-2 in a third exemplary fabrication stage illustrating formation of an oxide layer over the top cap and the side spacers on a first fin of the exemplary fin array structure;

FIGS. 5D-1 and 5D-2 are a top view and a side cross-sectional view, respectively, of the exemplary fin array structure of FIGS. 5C-1 and 5C-2, in a fourth exemplary fabrication stage illustrating removal of the top cap and the side spacers from a second fin of the exemplary fin array structure;

FIGS. 5E-1, 5E-2, and 5E-3 are a top view and side cross-sectional views, respectively, of the exemplary fin array structure of FIGS. 5D-1 and 5D-2, in a fifth exemplary fabrication stage in which the oxide layer on the first fin is removed, a shallow trench isolation (STI) oxide layer is formed on a surface of the substrate to provide lateral isolation between fins of the fin array structure, and source/drain regions are formed on the second fin;

FIGS. 5F-1 and 5F-2 are a top view and a cross-sectional view, respectively, of the exemplary fin array structure of FIGS. 5E-1 and 5E-2 in a sixth exemplary fabrication stage illustrating formation of a gate dielectric material and a gate material on side and top outer surfaces of a channel region in the second fin and an outer surface of a corresponding region of the first fin and on the STI oxide layer;

FIG. 5G-1 is a top view of the exemplary fin array structure of FIG. 5F-1 in a seventh exemplary fabrication stage illustrating formation of metal interconnects over the fin array structure;

FIGS. 5G-2 and 5G-3 are side cross-sectional views of the exemplary fin array structure in FIG. 5G-1 including the metal interconnects in contact with the source/drain regions of the second fin outside the channel region;

FIGS. 5H-1 and 5H-2 are a top view and a side cross-sectional view, respectively, of the exemplary fin array structure in FIGS. 5G-1, 5G-2, and 5G-3, in a final fabrication stage illustrating formation of an interlayer dielectric (ILD) layer to form an exemplary IC;

FIGS. 5I-1 and 5I-2 are a top view and a side cross-sectional view, respectively, of an alternative example of the IC in FIGS. 3A and 3B, in which the fin array structure includes a second active fin employed in the FinFET, and the dummy fin is immediately neighboring a first active fin at a uniform spacing;

DETAILED DESCRIPTION

Figure 1:
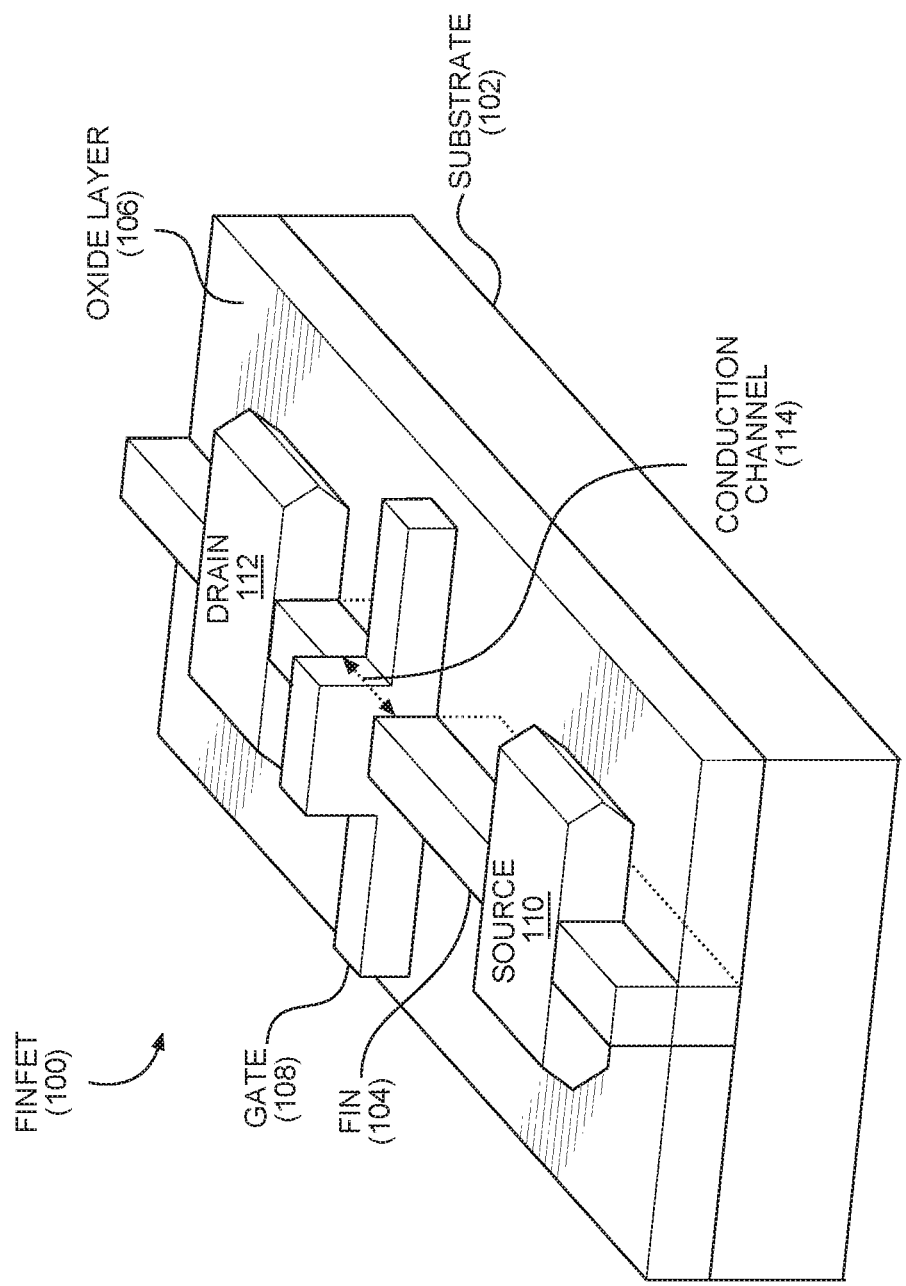
FIG. 1 is an illustration of a perspective view of an exemplary Fin Field-Effect Transistor (FET) (FinFET) with a single fin.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include an integrated circuit (IC) employing a channel structure layout having an active semiconductor channel structure(s) and an isolated neighboring dummy semiconductor channel structure(s). For example, this may provide for improved uniformity in spacing between adjacent channel structures in an IC. A semiconductor channel structure(s) in an IC may be a fin structure(s) or a gate-all-around (GAA) structure(s) employed in a Field-Effect Transistor (FET), such as a FinFET or a three-dimensional (3D) FET as examples. The channel structures formed in the IC may be fabricated according to a circuit cell architecture, such as a standard circuit cell also known as a "standard cell." In exemplary aspects disclosed herein, the IC includes at least one active (e.g., diffusion) region in which an array of semiconductor channel structures (e.g., a semiconductor fin array) may be formed according to a pattern. The IC includes a semiconductor device (e.g., a FinFET) that employs an array of semiconductor channel structures in the active region of the IC. The channel structure array in the active region may include one active semiconductor channel structure (e.g., an active fin) for reduced power consumption in the FinFET, and may include at least one neighboring dummy semiconductor channel structure (e.g., a "dummy fin") for increased uniformity.

In exemplary aspects disclosed herein, a neighboring dummy semiconductor channel structure is not electrically active in the IC, because the neighboring dummy semiconductor channel structure is isolated by a capping layer disposed over an outer surface of the neighboring dummy semiconductor channel structure. The capping layer protects the semiconductor structure of the dummy semiconductor channel structure from processes for forming source/drain regions in the active channel structure, and electrically isolates the dummy semiconductor channel structure from the IC. In contrast, removing an immediately adjacent dummy semiconductor channel structure during fabrication of the active channel structure(s) may create non-uniform spacing (i.e., a gap wider than spacing by a channel structure array pitch) between the active semiconductor channel structure and a nearest adjacent semiconductor channel structure. Non-uniform spacing increases variations in the formation of the active semiconductor channel structure and variations in subsequent processing of the active semiconductor channel structure. Such increased variations lead to unpredictable and non-uniform operating characteristics in the IC.

In this regard, FIG. 3A is a top view of an exemplary IC 300. FIG. 3B is a cross-sectional side view of the IC 300 in FIG. 3A along line A-A'. The IC 300 is fabricated according to a circuit layout 301, which is a layout of components commonly used to fabricate semiconductor circuits including, but not limited to, diffusion regions, semiconductor channel structures, gates, and metal interconnect lines according to design parameters, including area and node size. In this example, the IC 300 is formed to support complementary metal oxide semiconductor (MOS) (CMOS) circuits. CMOS circuits include at least one first type of transistor and at least one complement type transistor, such that the complement type has a doping that is opposite of a doping of the first type. For example, if the at least one first transistor is formed of a semiconductor material having a first doping that is N-type, the at least one complement transistor is formed of a semiconductor material having a complement doping that is P-type. Conversely, if the at least one first transistor is formed of a semiconductor material having a first doping that is P-type, the at least one complement transistor is formed of a semiconductor material having a complement doping that is N-type. In this regard, the IC 300 includes a channel structure array 302P comprising a plurality of P-type semiconductor channel structures 303P(1)-303P(3) ("P-type channel structures 303P(1)-303P(3)") formed from a semiconductor material 306 in a P-type diffusion region 304P of a substrate 308. Similarly, a complement channel structure array 302N comprising a plurality of N-type (i.e., complement) semiconductor channel structures 303N(1)-303N(3) ("N-type channel structures 303N(1)-303N(3)") is formed from the semiconductor material 306 in an N-type diffusion region 304N of the substrate 308. Note that although three (3) P-type channel structures 303P(1)-303P(3) and three (3)N-type channel structures 303N(1)-303N(3) are included in the IC 300, any number of such channel structures may be included. The channel structure 303P(2) in the channel structure array 302P is disposed along a first longitudinal axis $A_1$, and the P-type channel structures 303P(1) and 303P(3) are disposed along a second longitudinal axis $A_2$ and a third longitudinal axis $A_3$, respectively, which are substantially parallel to the first longitudinal axis $A_1$, such that the P-type channel structures 303P(1)-303P(3) are each spaced by a channel structure pitch $P_1$. As shown in FIGS. 3A and 3B, the P-type channel structure 303P(2) is immediately adjacent to the P-type channel structure 303P(1) and immediately adjacent to the P-type channel structure 303P(3). The N-type channel structures 303N(1)-303N(3) in the channel structure array 302N are disposed along substantially parallel longitudinal axes $A_5$, $A_4$, and $A_6$, respectively, in a manner corresponding to the P-type channel structures 303P(1)-303P(3), and spaced by a complement channel structure pitch $P_2$.

With continuing reference to FIGS. 3A and 3B, the P-type channel structures 303P(1)-303P(3) may be employed in a Field-Effect Transistor (FET) 310 but, in the example in FIGS. 3A and 3B, only the one active P-type channel structure 303P(2) is employed as a channel in the FET 310 for purposes of reduced power consumption. The channel size affects current flow and drive strength of the FET 310, and thus reducing the channel size can reduce power consumption. In the example in FIGS. 3A and 3B, the P-type channel structures 303P(1)-303P(3) of the channel structure array 302P are semiconductor fins ("fins") such that the FET 310 is a FinFET 311 so the channel structure array 302P may also be referred to herein as a fin array 305P. Thus, the P-type channel structures 303P(1)-303P(3) may be referred to herein as fins 307P(1)-307P(3), and the FET 310 may be referred to as a FinFET 311. Each of the P-type channel structures 303P(1)-303P(3) includes a channel region 312 acting as a semiconductor channel. For example, the P-type channel structures 303P(1)-303P(3) may be Silicon (Si) or another semiconductor material. A first source/drain region $SD_1$ and a second drain/source region $SD_2$ are formed in the active fin 307P(2) at first and second end portions, respectively, of a channel region 312. The first source/drain region $SD_1$ and the second drain/source region $SD_2$ are interchangeable as a source and a drain in the FinFET 311. In one example, the first source/drain region $SD_1$ is employed as a drain in the FinFET 311, and the second drain/source region $SD_2$ is employed as a source. In another example, the first source/drain region $SD_1$ is employed as a source in the FinFET 311, and the second drain/source region $SD_2$ is employed as a drain. A third source/drain region $SD_3$ and a fourth drain/source region $SD_4$ are similarly interchangeable in a FinFET 316 in the N-type diffusion region 304N.

A gate $G_1$ (e.g., of a metal material) is formed over the channel region 312. The gate $G_1$ controls current in the channel region 312 between the first source/drain region $SD_1$ and the second source/drain region $SD_2$ in the active fin 307P(2). As shown in FIG. 3B, which shows side cross-sectional views of the fins 307P(1)-307P(2), the gate $G_1$ is formed around an outer surface 313 of the channel region 312. In this example, gates $G_2$ and $G_3$ are also formed around other regions of the active fin 307P(2). The gates $G_1$-$G_3$ are also formed over the fins 307P(1) and 307P(3). In this example, the fins 307P(1) and 307P(3) are dummy fins, which are not electrically active because of isolation provided by a capping layer 314. The capping layer 314 (e.g., a Silicon Nitride (SiN) layer) is formed on the outer surface 313 of each of the fins 307P(1) and 307P(3) to provide isolation from fin processing and from electrical coupling to the FinFET 311. Thus, the gates $G_1$-$G_3$ are formed on the capping layer 314 in the channel region 312 of the dummy fins 307P(1) and 307P(3) in the fin array 305P. Due to the presence of the capping layer 314 over the dummy fins 307P(1) and 307P(3), no source/drain region can be formed in the dummy fins 307P(1) and 307P(3), and the dummy fins 307P(1) and 307P(3) are electrically isolated from the IC 300. The gates $G_1$-$G_3$ are also formed over the fins 307N(1)-307N(3) in the N-type diffusion region 304N.

With further reference to FIG. 3B, the capping layer 314 includes a top cap 322 on a top surface 324 of the fin 307P(1) and side spacers 326 on first and second side surfaces 328A and 328B of the fin 307P(1). A shallow trench isolation (STI) layer 330 is formed on the substrate 308 to provide lateral isolation between adjacent fins. A gate insulator (e.g., a high-K gate oxide layer) 332 is formed over the channel region 312 of the active fin 307P(2) to insulate the channel region 312 from the gate $G_1$. The gate insulator 332 is formed over the fins 307P(1)-307P(3) and 307N(1)-307N(3) wherever the gate $G_1$ is to be formed. A protective interlayer dielectric (ILD) layer 334 is also formed over the IC 300.

The IC 300 may include the FinFET 316 formed in the N-type diffusion region 304N. The N-type diffusion region 304N may have a fin array 305N. The FinFET 316 may have elements that are complementary to each of the elements of the FinFET 311. The P-type diffusion region 304P and the N-type diffusion region 304N may be separated by an isolation (e.g., non-diffusion) region 318 of the substrate 308. The FinFET 311 and the FinFET 316 in the example in FIG. 3A are electrically connected by a metal interconnect 320. Specifically, the metal interconnect 320 is a layer that include metal interconnects to electrically couple the first source/drain region $SD_1$ of the active fin 307P(2) to the third source/drain region $SD_3$ of the active fin 307N(2) for forming a circuit. Finally, the IC 300 is powered by supply voltages (e.g., $V_{DD}$ and ground) coupled to power rails $V_1$ and $V_2$ in the IC 300, which are interconnected to the FinFET 311.

In the IC 300 of FIGS. 3A and 3B, the FinFET 311 employs the channel structure array 302P including the P-type channel structures 303P(1)-303P(3). The P-type channel structure 303P(2) provides the only channel for current flow between the first source/drain region $SD_1$ and the second drain/source region $SD_2$ in the FinFET 311. The P-type channel structures 303P(1) and 303P(3) are dummy fins 307P(1) and 307P(3) that are electrically inactive in the FinFET 311, because they are isolated by the capping layer 314. Although the P-type channel structures 303P(1) and 303P(3) are not electrically active in the FinFET 311, they are formed at a uniform spacing from the P-type channel structure 303P(2), and are not subsequently removed, because their presence provides a more uniform environment for the formation of the P-type channel structure 303P(2) and for the subsequent formation of the first source/drain region $SD_1$ and the second drain/source region $SD_2$. Similarly, the N-type channel structures 303N(1) and 303N(3) are dummy fins 307N(1) and 307N(3) that are not electrically active in the FinFET 316, but are formed at a uniform spacing from the N-type channel structure 303N(2) to provide a more uniform environment for formation of the N-type channel structure 303N(2) and for the subsequent formation of the third source/drain region $SD_3$ and the fourth drain/source region $SD_4$. In the absence of the dummy fins 307P(1), 307P(3), 307N(1), and 307N(3), variations and defects occurring in the formation and processing of the active fins 307P(2) and 307N(2) may be significantly increased.

Figure 4:
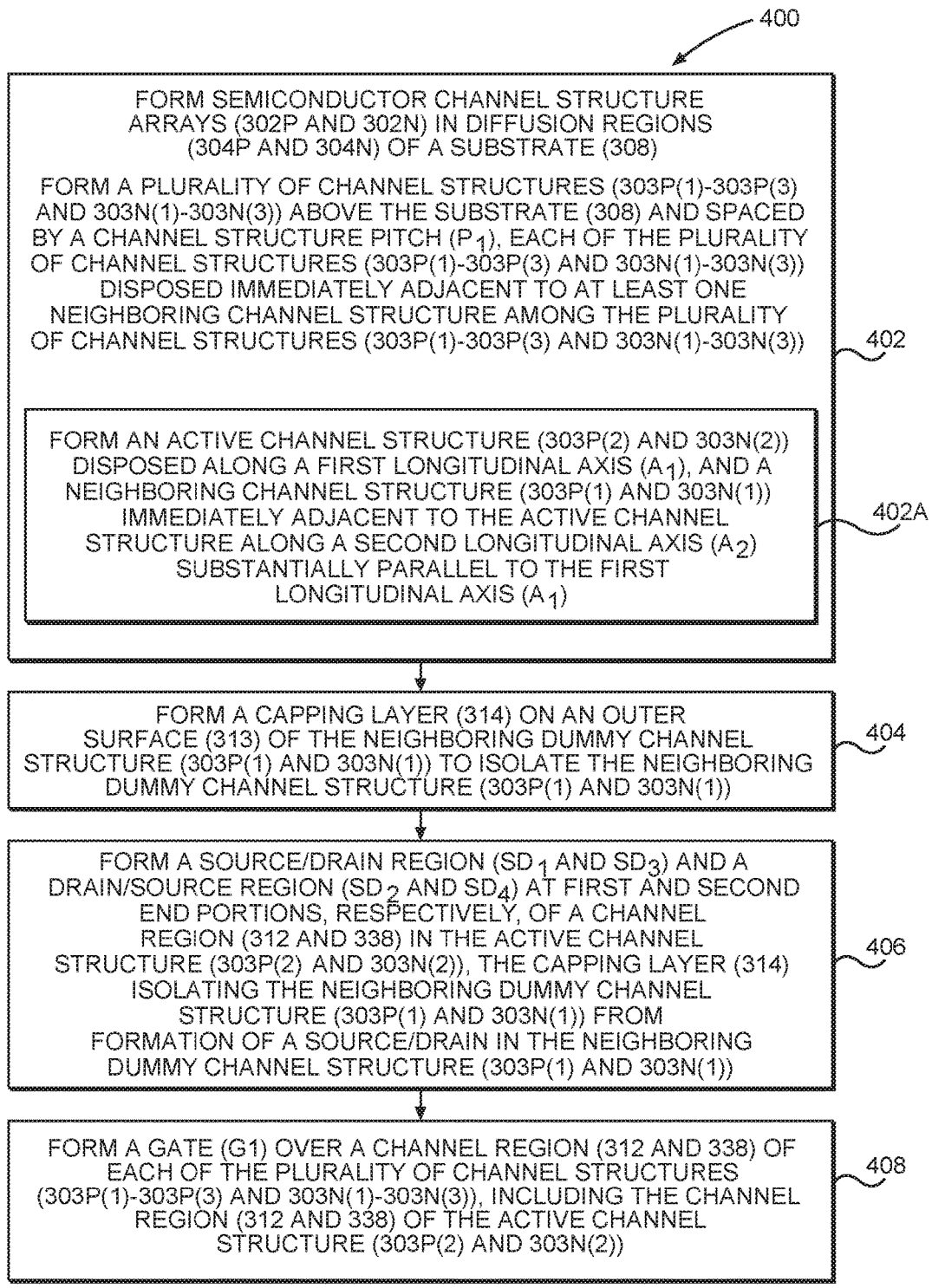
FIG. 4 is a flowchart illustrating an exemplary process for fabricating an IC that includes an array of channel structure array comprising at least one structure having an active channel region subject to control by a gate disposed over the channel structure array, and at least one isolated dummy structure that is immediately neighboring to one of the at least one structures at a uniform spacing, and is electrically isolated from the IC by a capping layer, such as the IC in FIGS. 3A and 3B.

FIG. 4 is a flowchart that illustrates an exemplary process 400 for fabricating the exemplary IC 300 in FIGS. 3A and 3B. Aspects of the process 400 in FIG. 4 are discussed in detail and in conjunction with exemplary fabrication stages 500(A)-500(D) illustrated in FIGS. 5A-1 and 5A-2 through 5I-1 and 5I-2. Common components between the IC 300 and the exemplary fabrication stages 500(A)-500(D) illustrated in FIGS. 5A-1 and 5A-2 through 5I-1 and 5I-2 are shown with common element numbers in FIGS. 5A-1 and 5A-2 through 5I-1 and 5I-2.

Figures 1, 2, 5B:
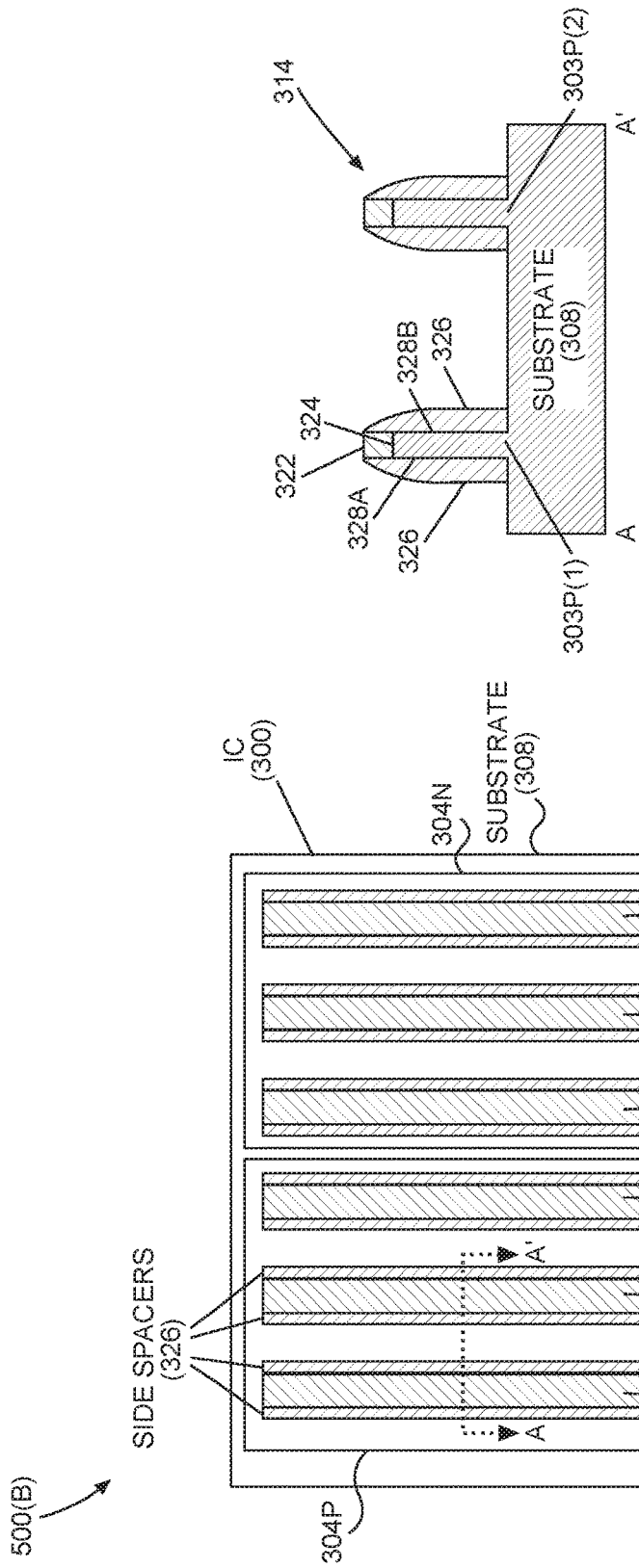

In this regard, a first exemplary step in the process 400 in FIG. 4 is to form the channel structure array 302P in the P-type diffusion region 304P, in which P-type material(s) has been diffused into the substrate 308. In addition, the channel structure array 302N is formed in the N-type diffusion region 304N, in which N-type material(s) has been diffused into the substrate 308 (FIG. 4, block 402). In this regard, FIGS. 5A-1 and 5A-2 illustrate a top view and a side view, respectively, of an exemplary fabrication stage 500(A) of the IC 300 in FIG. 3 that illustrates the channel structure arrays 302P and 302N in the diffusion regions 304P and 304N, respectively, on the substrate 308. As an example, to form the channel structure arrays 302P and 302N, photolithographic methods can be employed to form a hard mask layer on a top surface of the diffusion regions 304P and 304N. The hard mask layer includes hard mask portions 323 that extend in the X-axis direction and are spaced apart in the Y-axis direction according to the channel structure pitch $P_1$. The hard mask portions 323 are located where the channel structures 303P(1)-303P(3) and 303N(1)-303N(3) are to be formed in the diffusion regions 304P and 304N above the substrate 308. The semiconductor material 306 can then be removed by an etching process according to a hard mask pattern. In this manner, there is a uniform spacing as evidenced by the channel structure pitch $P_1$ between the longitudinal axes $A_1$ and $A_2$ of the neighboring P-type channel structures 303P(1) and 303P(2), for example, formed by the etching process. As previously discussed, the uniform spacing provides a uniform environment for the channel structure formation.

In this example, the semiconductor material 306 is not removed below the portions of the hard mask layer, but, where a void exists in the hard mask pattern, the underlying semiconductor material 306 is removed. Portions of the semiconductor material 306 remaining on the substrate 308 after the etching process form the channel structure arrays 302P and 302N. In the first exemplary step in the process 400, each one of the P-type channel structures 303P(1)-303P(3) and the N-type channel structures 303N(1)-303N(3) is disposed immediately adjacent to at least one neighboring channel structure (FIG. 4, block 402). In particular, in the first exemplary step of process 400, the P-type channel structures 303P(2) and 303P(1) illustrated in FIG. 5A-1 are disposed along the first longitudinal axis $A_1$ and the second longitudinal axis $A_2$, respectively, which are substantially parallel to each other in the Y-axis direction and spaced apart in the X-axis direction (FIG. 4, block 402A). As shown in cross-section in FIG. 5A-2, the top caps 322 are formed by the hard mask portions 323 remaining on the top surfaces 324 of the fins 307P(1) and 307P(2). The top caps 322 are a component of the capping layer 314 formed on the outer surface 313 of the dummy fins 307P(1), 307P(3), 307N(1), and 307N(3). Alternatively, the hard mask portions 323 may be removed after etching the substrate 308 to form the channel structure arrays 302P and 302N, and the top caps 322 can be formed by another process.

A second exemplary step in the process 400 in FIG. 4 is to form the capping layer 314 on the outer surface 313 of each of the P-type channel structures 303P(1)-303P(3) and N-type channel structures 303N(1)-303N(3) (FIG. 4, block 404). In this regard, FIGS. 5B-1 and 5B-2 are a top view and a side view, respectively, illustrating an exemplary fabrication stage 500(B) of the capping layer 314, including the side spacers 326 disposed on the outer side surfaces 328A and 328B of the fins 307P(1)-307P(3) and 307N(1)-307N(3) and the top caps 322. Initially, the capping layer 314 is formed on the outer surface 313 of each of the P-type channel structures 303P(1)-303P(3) and the N-type channel structures 303N(1)-303N(3). Then, as described below, the capping layer 314 is removed from only the active P-type channel structure 303P(2) and the active N-type channel structure 303N(2). Due to the remaining capping layer 314, each of the neighboring dummy channel structures 303P(1), 303P(3), 303N(1), and 303N(3) are isolated from subsequent processing and are electrically isolated from the IC 300.

To remove the capping layer 314 from the P-type channel structure 303P(2) and the N-type channel structure 303N(2), an oxide layer 336 is formed over the channel structures 303P(1)-303P(3) and 303N(1)-303N(3). As illustrated in FIGS. 5C-1 and 5C-2, the oxide layer 336 is then selectively removed from the P-type channel structure 303P(2) and the N-type channel structure 303N(2). The oxide layer 336 is employed as a protective mask to cover the capping layer 314 on the channel structures 303P(1), 303P(3), 303N(1), and 303N(3) during a process that removes the capping layer 314 from the channel structures 303P(2) and 303N(2), as shown in FIGS. 5D-1 and 5D-2.

Figures 2, 5E:
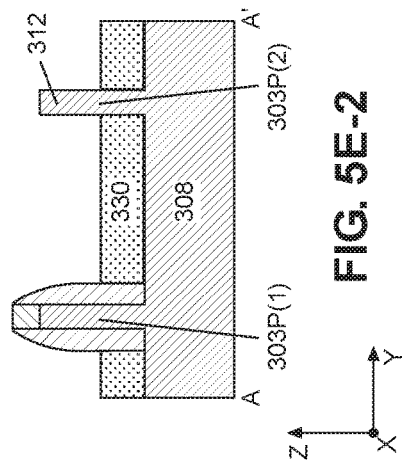
Figures 1, 5E:
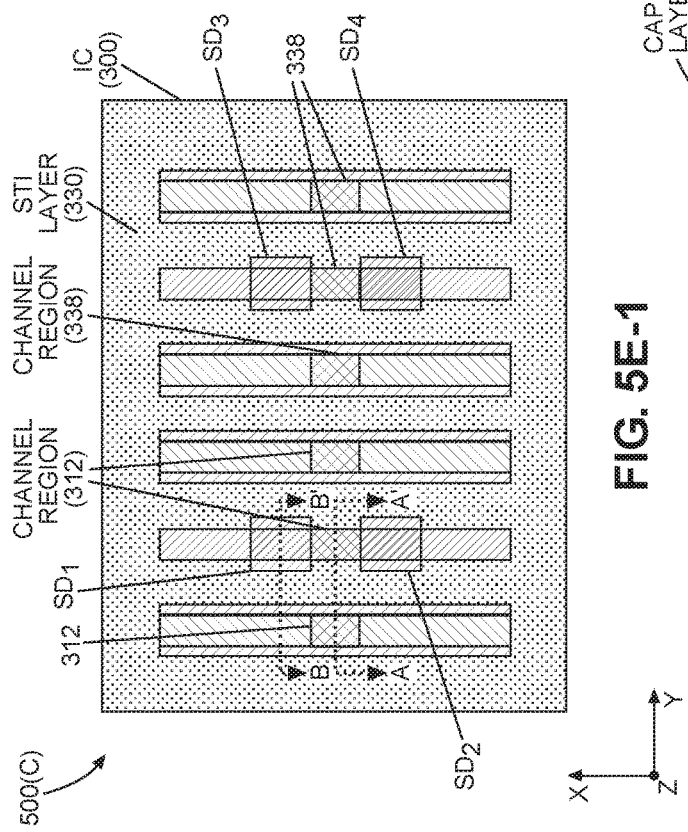
Figures 3, 5E:
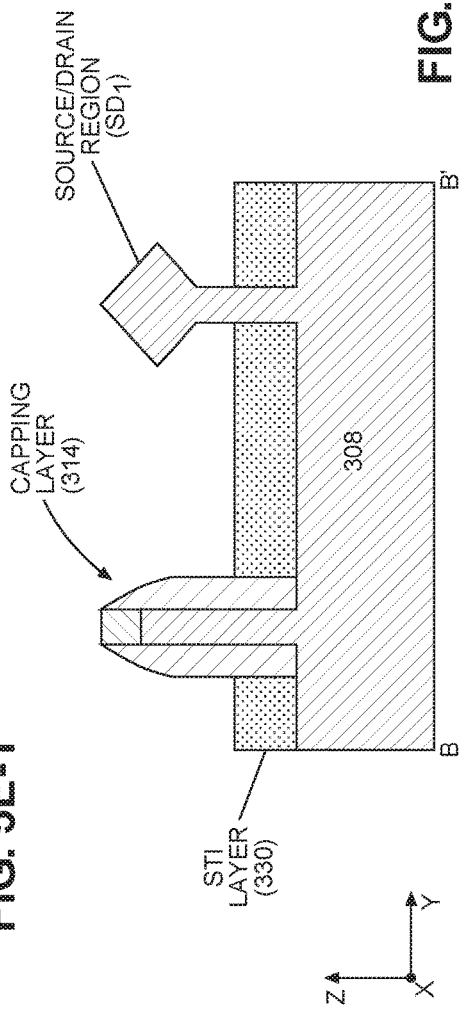

A third exemplary step in the process 400 in FIG. 4 is to form the first source/drain region $SD_1$ at a first end portion of the channel region 312 in the P-type channel structure 303P(2), and form a second drain/source region $SD_2$ at a second end portion of the channel region 312 in the P-type channel structure 303P(2) (FIG. 4, block 406). Similarly, the third source/drain region $SD_3$ is formed at a first end portion of a channel region 338 in the N-type channel structure 303N(2), and the fourth drain/source region $SD_4$ is formed at a second end portion of the channel region 338 in the N-type channel structure 303N(2). In this regard, FIGS. 5E-1, 5E-2, and 5E-3 are a top view, a side view along line A-A', and a side view along line B-B', respectively, of an exemplary fabrication stage 500(C) illustrating the STI layer 330 disposed on surfaces of the substrate 308 to provide lateral isolation between the P-type channel structures 303P(1)-303P(3) and between the N-type channel structures 303N(1)-303N(3). A portion of the channel structures 303P(2) and 303N(2) (the fins 307P(2) and 307N(2)) that remains exposed above the STI layer 330 may be referred to as active. Current flow in the FinFETs 311 and 316 occurs in the active portions of the channel structures 303P(2) and 303N(2). A dummy gate (not shown) is formed over the exposed (active) portions of the fins 307P(2) and 307N(2) in the channel regions 312 and 338, to protect the channel regions 312 and 338 during a process in which the first source/drain region $SD_1$, the second drain/source region $SD_2$, the third source/drain region $SD_3$, and the fourth drain/source region $SD_4$ are formed. In this regard, the first source/drain region $SD_1$ and the second drain/source region $SD_2$ are formed (e.g., by ion implantation or epitaxial growth) at a first end portion and a second end portion, respectively, of the channel region 312 of the fin 307P(2). A cross-sectional side view of the first source/drain region $SD_1$ in the fin 307P(2) (with the dummy gate removed) is shown in FIG. 5E-3. The dummy gate is also disposed over the channel region 338 of the fin 307N(2). The third source/drain region $SD_3$ and the fourth drain/source region $SD_4$ are formed at first and second end portions, respectively, of the channel region 338. The capping layer 314 on the outer surface 313 of the dummy P-type channel structure 303P(1) isolates the dummy P-type channel structure 303P(1) from formation of source/drain regions in the dummy P-type channel structure 303P(1). Similarly, the dummy channel structures 303P(3), 303N(1), and 303N(3) are isolated by the capping layer 314 formed thereon from forming source/drain regions.

A fourth exemplary step in the process 400 in FIG. 4 is to form the gate $G_1$ over the channel regions 312 and 338 of each of the P-type channel structures 303P(1)-303P(3) and the N-type channel structures 303N(1)-303N(3) (FIG. 4, block 408). In this regard, FIGS. 5F-1 and 5F-2 are a top view and a side view, respectively, of an exemplary fabrication stage 500(D) illustrating the gate $G_1$ employed in the FinFETs 311 and 316. In the fourth exemplary step, with the dummy gate removed, the gate insulator 332 is disposed over the channel regions 312 and 338, respectively, of the dummy channel structures 303P(1)-303P(3) and 303N(1)-303N(3). The gate $G_1$ is formed over the gate insulator 332 in the channel regions 312 and 338 of each of the channel structures 303P(1)-303P(3) and 303N(1)-303N(3). The gate insulator 332 isolates the channel regions 312 and 338 of the channel structures 303P(2) and 303N(2), respectively, from the gate $G_1$. The dummy channel structures 303P(1), 303P(3), 303N(1), and 303N(3) are isolated from the gate $G_1$ by the gate insulator 332, and also by the capping layer 314.

Figures 1, 5G:
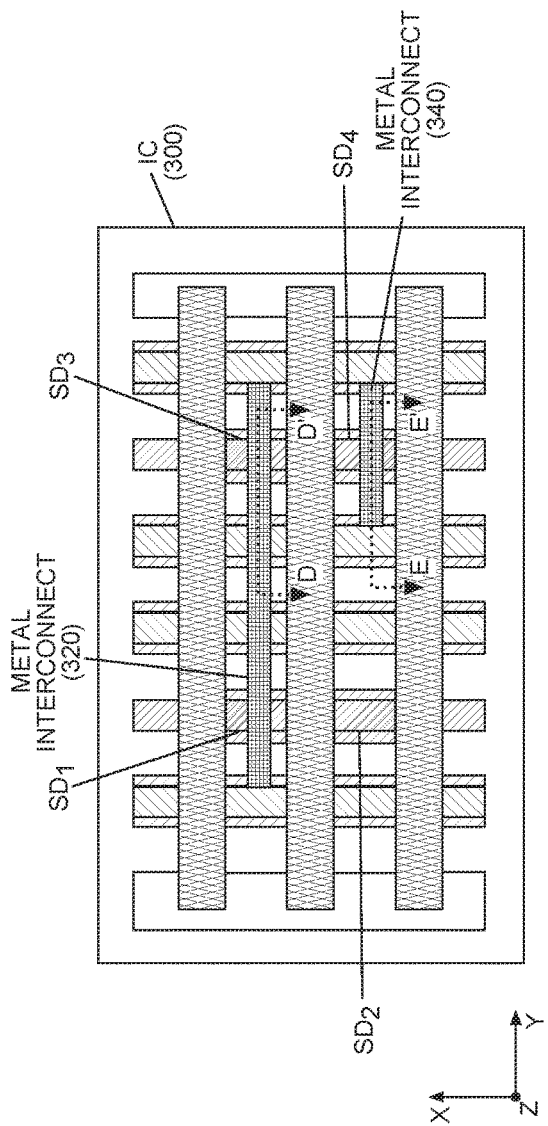
Figures 3, 5G:
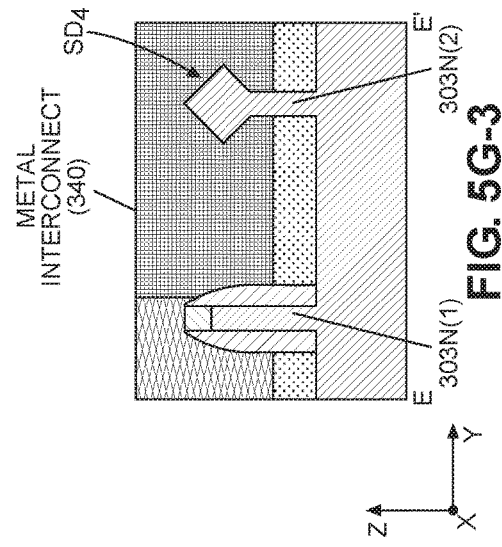
Figures 2, 5G:
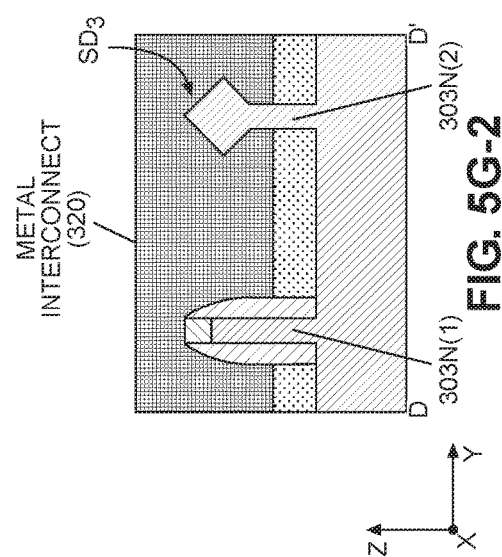
Figures 2, 5H:
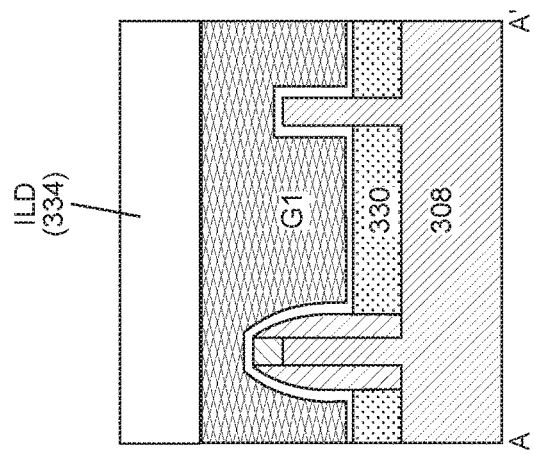
Figures 1, 5H:
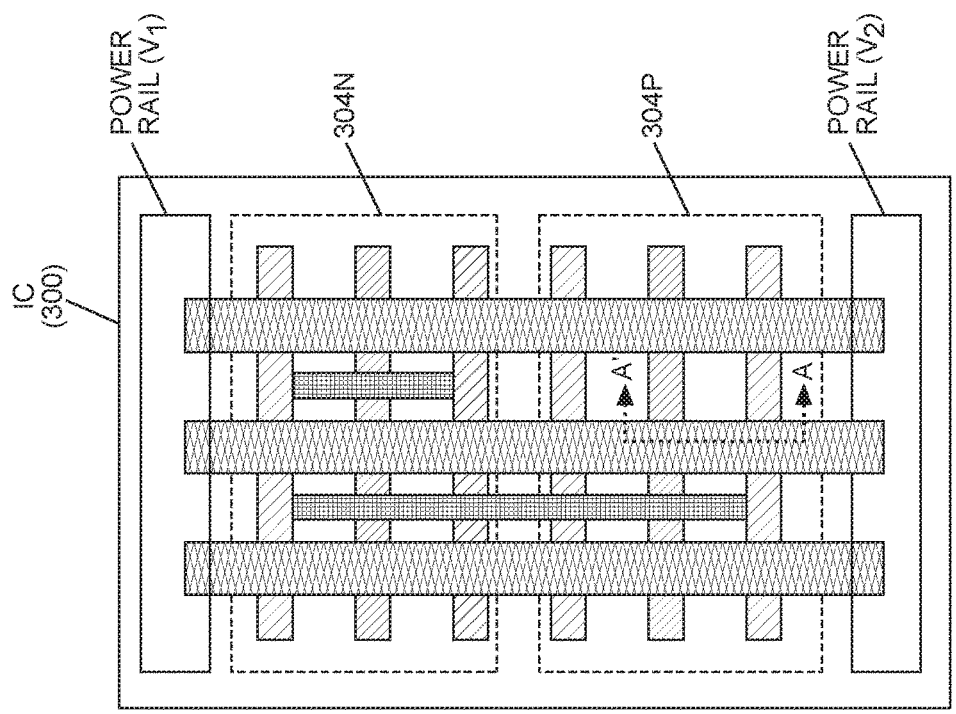

FIGS. 5G-1 through 5G-3 illustrate a top view, a side view along line D-D', and a side view along line E-E' of the IC 300 in FIGS. 5F-1 and 5F-2 with the addition of the metal interconnects 320 and 340. The metal interconnect 320 extends over the first source/drain region $SD_1$ in the active P-type channel structure 303P(2) of the FinFET 311 and over the third source/drain region $SD_3$ in the active channel structure 303N(2) of the FinFET 316 to electrically couple the first source/drain region $SD_1$ to the third source/drain region $SD_3$. The FinFET 311 of the P-type diffusion region 304P and the FinFET 316 of the N-type diffusion region 304N may be employed in the IC 300 to form a CMOS circuit. The metal interconnect 340 may provide a contact point to the fourth drain/source region $SD_4$, such as for a connection external to the IC 300. FIGS. 5H-1 and 5H-2 show a top view and a side cross-sectional view along the line A-A', respectively, of the IC 300 of FIGS. 5G-1 through 5G-3 with the protective ILD layer 334 formed over the gate $G_1$.

Figures 2, 5I:
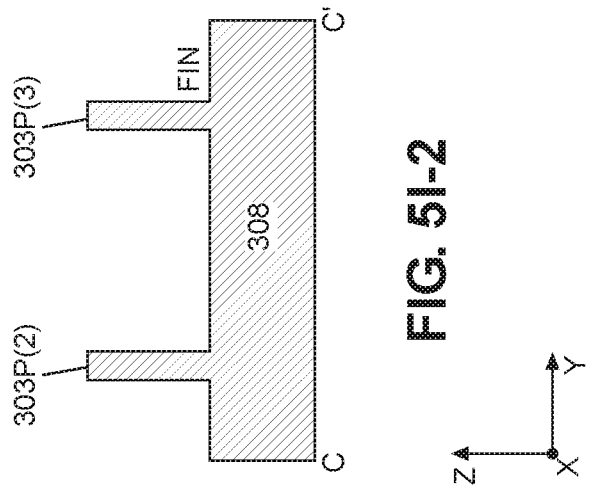
Figures 1, 5I:
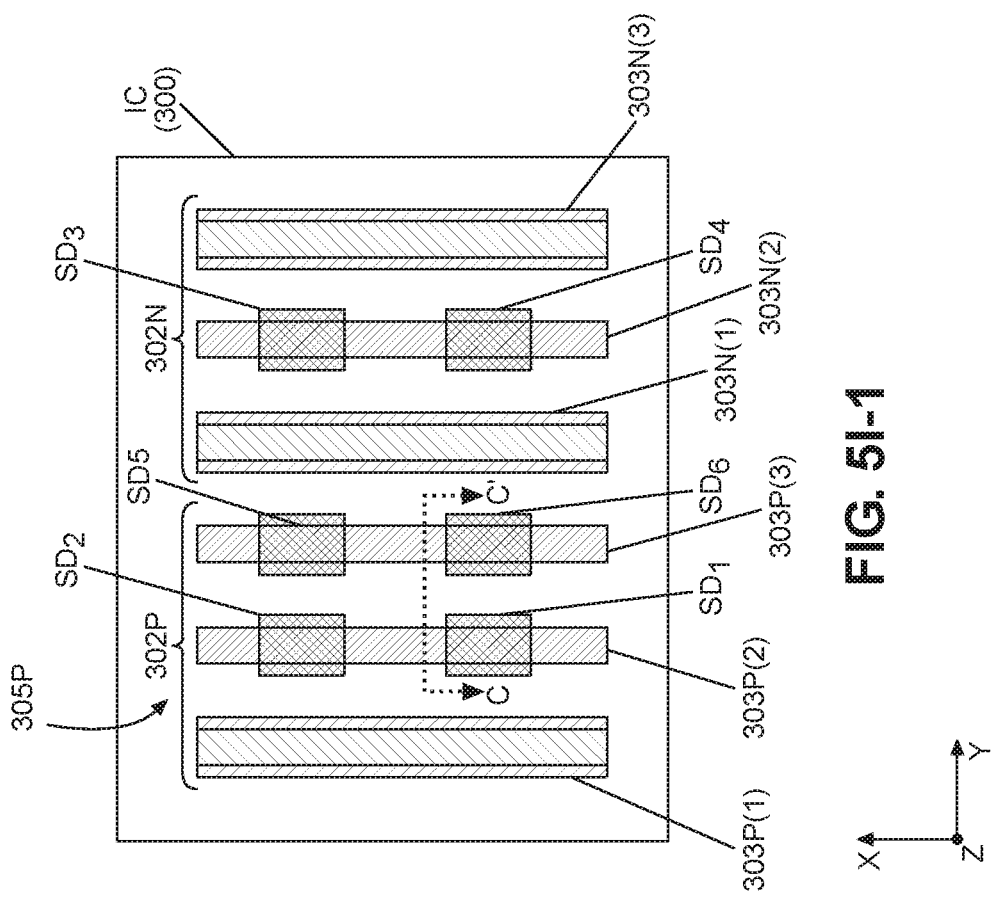

Another example of the fin array 305P is shown in FIGS. 5I-1 and 5I-2. This example shows that the dummy P-type channel structure 303P(1) is beneficial to the formation and subsequent processing of the active P-type channel structure 303P(2) whether the P-type channel structure 303P(3) is an active channel structure or a dummy channel structure. If the FinFET 311 is to employ both of the P-type channel structures 303P(2) and 303P(3) as active channel structures, such as for increased drive strength, a source/drain region SD5 and a drain/source region SD6 are formed in P-type channel structure 303P(3). Whether the P-type channel structure 303P(3) is an active channel structure or a dummy channel structure, the neighboring dummy P-type channel structure 303P(1) immediately adjacent to the active P-type channel structure 303P(2), and spaced uniformly at the channel structure pitch $P_1$ from the P-type channel structure 303P(2), helps to avoid an increase in process variations occurring during formation and subsequent processing of the P-type channel structure 303P(2) that can cause performance variations and defects in the IC 300.

The IC 300 employing a channel structure layout having an active semiconductor channel structure(s) and an isolated neighboring dummy semiconductor channel structure(s) for increased uniformity according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 6:
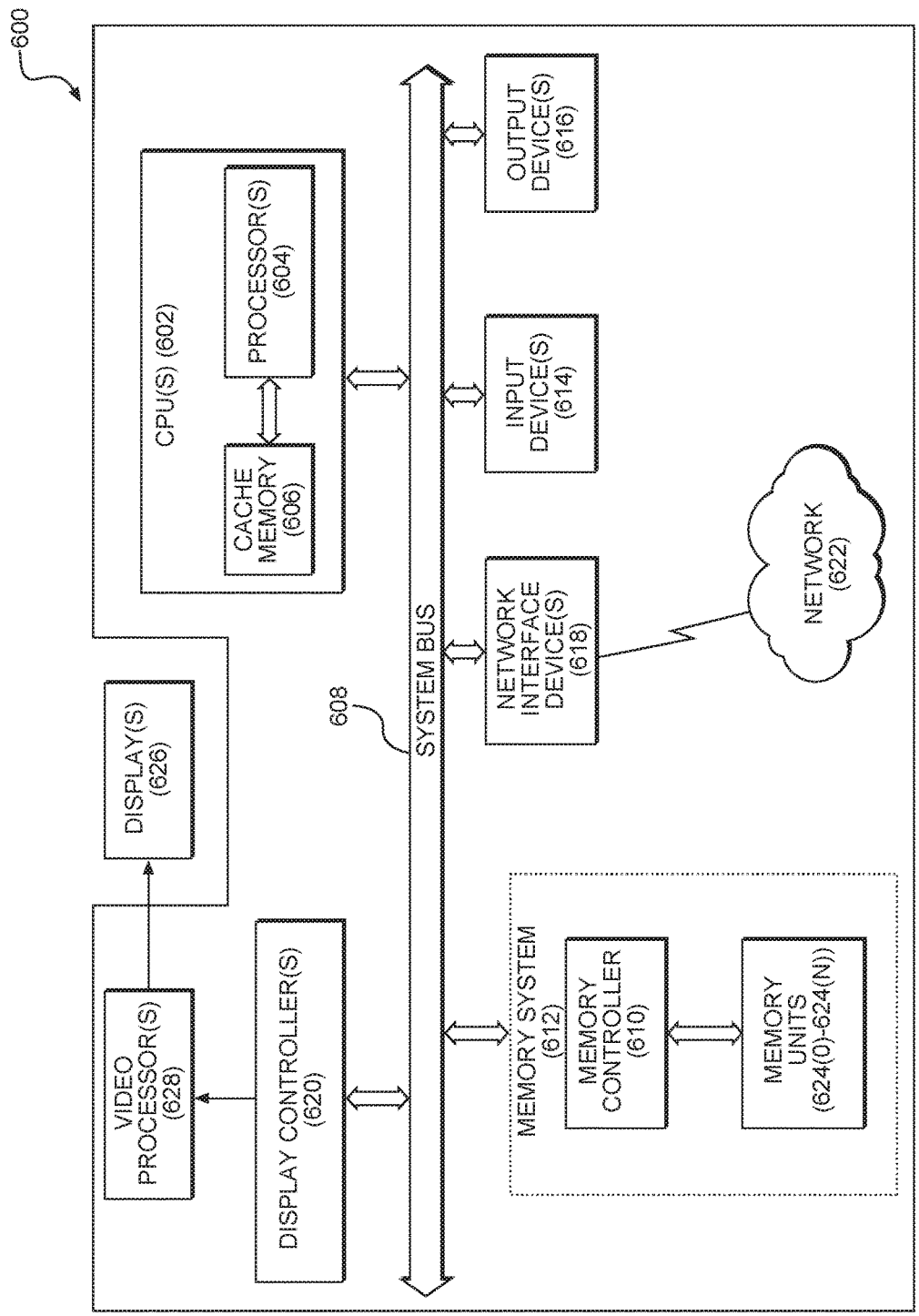
FIG. 6 is a block diagram of an exemplary processor-based system that can include an IC including a channel structure array (e.g., "fin array") comprising at least one channel structure having an active channel region subject to control by a gate disposed over the fin array structure, and at least one isolated dummy structure that is immediately neighboring the active structure at a uniform spacing, and is electrically isolated from the IC by a capping layer.

In this regard, FIG. 6 illustrates an example of a processor-based system 600 that can employ an IC employing a channel structure layout having an active semiconductor channel structure(s) and an isolated neighboring dummy semiconductor channel structure(s) for increased uniformity, as illustrated in FIG. 5I-1. In this example, the processor-based system 600 includes one or more CPUs 602, each including one or more processors 604. The CPU(s) 602 may have cache memory 606 coupled to the processor(s) 604 for rapid access to temporarily stored data. The CPU(s) 602 is coupled to a system bus 608 and can intercouple master and slave devices included in the processor-based system 600. As is well known, the CPU(s) 602 communicates with these other devices by exchanging address, control, and data information over the system bus 608. For example, the CPU(s) 602 can communicate bus transaction requests to a memory controller 610 as an example of a slave device. Although not illustrated of FIG. 6, multiple system buses 608 could be provided, wherein each system bus 608 constitutes a different fabric.

Other master and slave devices can be connected to the system bus 608. As illustrated of FIG. 6, these devices can include a memory system 612, one or more input devices 614, one or more output devices 616, one or more network interface devices 618, and one or more display controllers 620, as examples. The input device(s) 614 can include any type of input device, including, but not limited to, input keys, switches, voice processors, etc. The output device(s) 616 can include any type of output device, including, but not limited to, audio, video, other visual indicators, etc. The network interface device(s) 618 can be any devices configured to allow exchange of data to and from a network 622. The network 622 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 618 can be configured to support any type of communications protocol desired. The memory system 612 can include one or more memory units 624(0)-624(N).

The CPU(s) 602 may also be configured to access the display controller(s) 620 over the system bus 608 to control information sent to one or more displays 626. The display controller(s) 620 sends information to the display(s) 626 to be displayed via one or more video processors 628, which process the information to be displayed into a format suitable for the display(s) 626. The display(s) 626 can include any type of display, including, but not limited to, a cathode ray tube (CRT), a liquid crystal display (LCD), a plasma display, a light emitting diode (LED) display, etc.

Figure 7:
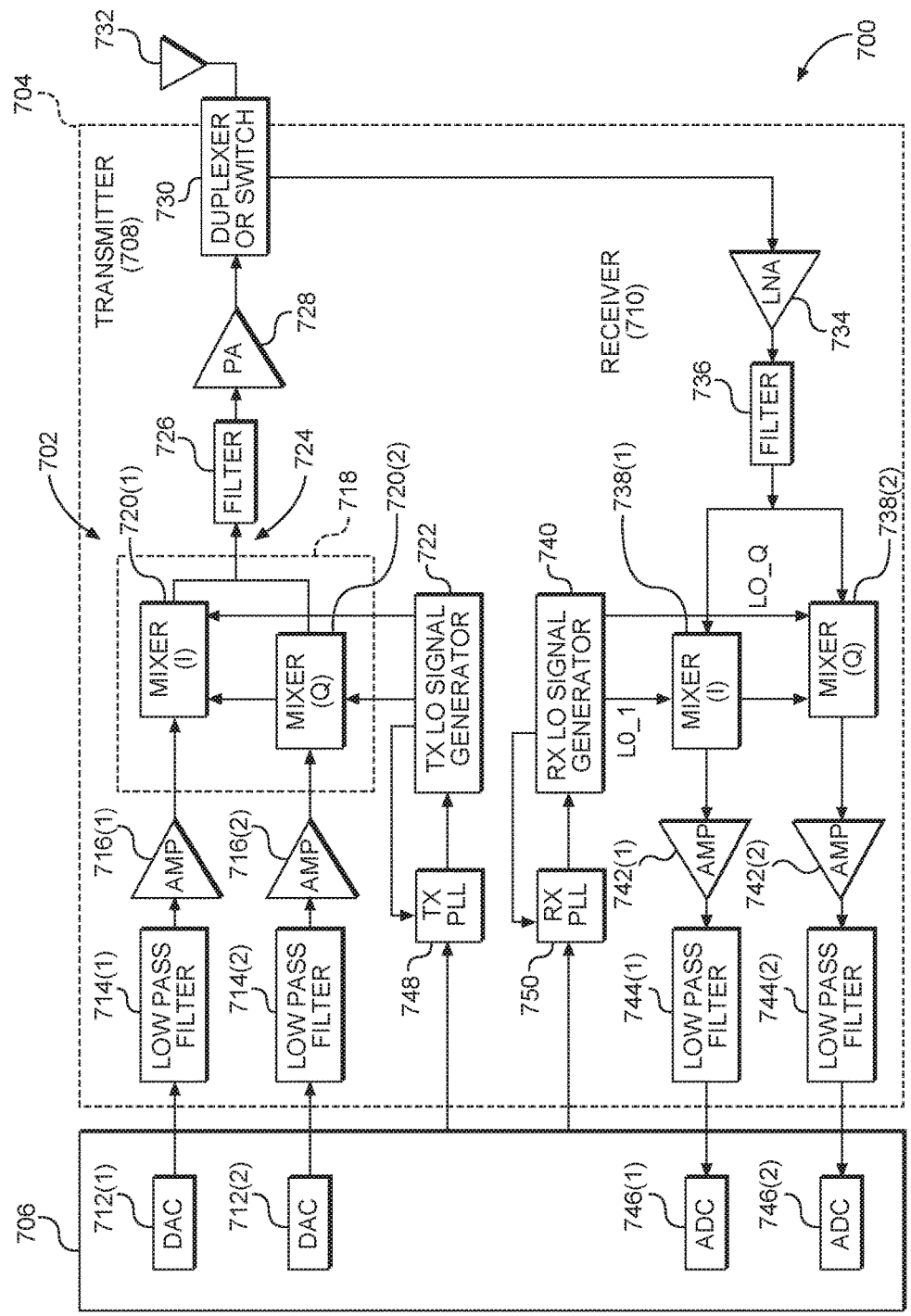
FIG. 7 is a block diagram of an exemplary wireless communications device that includes radio frequency (RF) components formed in an IC, wherein clocked circuits in the wireless communications device can include an IC including a channel structure array (e.g., "fin array") comprising at least one channel structure having an active channel region subject to control by a gate disposed over the fin array structure, and at least one isolated dummy structure that is immediately neighboring the active structure at a uniform spacing, and is electrically isolated from the IC by a capping layer.

FIG. 7 illustrates an exemplary wireless communications device 700 that includes radio frequency (RF) components formed in an IC 702, wherein the IC 702 can include an IC employing a channel structure layout having an active semiconductor channel structure(s) and an isolated neighboring dummy semiconductor channel structure(s) for increased uniformity. In this regard, the wireless communications device 700 may be provided in the IC 702. The wireless communications device 700 may include or be provided in any of the above-referenced devices, as examples. As shown of FIG. 7, the wireless communications device 700 includes a transceiver 704 and a data processor 706. The data processor 706 may include a memory (not shown) to store data and program codes. The transceiver 704 includes a transmitter 708 and a receiver 710 that support bi-directional communications. In general, the wireless communications device 700 may include any number of transmitters 708 and/or receivers 710 for any number of communication systems and frequency bands. All or a portion of the transceiver 704 may be implemented on one or more analog ICs, RF ICs (RFICs), mixed-signal ICs, etc.

The transmitter 708 or the receiver 710 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 710. In the direct-conversion architecture, a signal is frequency-converted between RF and baseband in one stage. The super-heterodyne and direct-conversion architectures may use different circuit blocks and/or have different requirements. In the wireless communications device 700 of FIG. 7, the transmitter 708 and the receiver 710 are implemented with the direct-conversion architecture.

In the transmit path, the data processor 706 processes data to be transmitted and provides I and Q analog output signals to the transmitter 708. In the exemplary wireless communications device 700, the data processor 706 includes digital-to-analog converters (DACs) 712(1), 712(2) for converting digital signals generated by the data processor 706 into the I and Q analog output signals, e.g., I and Q output currents, for further processing.

Within the transmitter 708, lowpass filters 714(1), 714(2) filter the I and Q analog output signals, respectively, to remove undesired signals caused by the prior digital-to-analog conversion. Amplifiers (AMPs) 716(1), 716(2) amplify the signals from the lowpass filters 714(1), 714(2), respectively, and provide I and Q baseband signals. An upconverter 718 upconverts the I and Q baseband signals with I and Q transmit (TX) local oscillator (LO) signals through mixers 720(1), 720(2) from a TX LO signal generator 722 to provide an upconverted signal 724. A filter 726 filters the upconverted signal 724 to remove undesired signals caused by the frequency upconversion as well as noise in a receive frequency band. A power amplifier (PA) 728 amplifies the upconverted signal 724 from the filter 726 to obtain the desired delivered power level and provides a transmitted RF signal. The transmitted RF signal is routed through a duplexer or switch 730 and transmitted via an antenna 732.

In the receive path, the antenna 732 receives signals transmitted by base stations and provides a received RF signal, which is routed through the duplexer or switch 730 and provided to a low noise amplifier (LNA) 734. The duplexer or switch 730 is designed to operate with a specific receive (RX)-to-TX duplexer frequency separation, such that RX signals are isolated from TX signals. The received RF signal is amplified by the LNA 734 and filtered by a filter 736 to obtain a desired RF input signal. Downconversion mixers 738(1), 738(2) mix the output of the filter 736 with I and Q RX LO signals (i.e., LO_I and LO_Q) from an RX LO signal generator 740 to generate I and Q baseband signals. The I and Q baseband signals are amplified by amplifiers (AMPs) 742(1), 742(2) and further filtered by lowpass filters 744(1), 744(2) to obtain I and Q analog input signals, which are provided to the data processor 706. In this example, the data processor 706 includes analog-to-digital converters (ADCs) 746(1), 746(2) for converting the analog input signals into digital signals to be further processed by the data processor 706.

In the wireless communications device 700 of FIG. 7, the TX LO signal generator 722 generates the I and Q TX LO signals used for frequency upconversion, while the RX LO signal generator 740 generates the I and Q RX LO signals used for frequency downconversion. Each LO signal is a periodic signal with a particular fundamental frequency. A TX phase-locked-loop (PLL) circuit 748 receives timing information from the data processor 706 and generates a control signal used to adjust the frequency and/or phase of the TX LO signals from the TX LO signal generator 722. Similarly, an LX PLL circuit 750 receives timing information from the data processor 706 and generates a control signal used to adjust the frequency and/or phase of the RX LO signals from the RX LO signal generator 740.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. An integrated circuit (IC), comprising:
 a substrate comprising a diffusion region;
 a semiconductor channel structure array disposed above the substrate in the diffusion region and comprising a plurality of channel structures each spaced by a channel structure pitch;
  each channel structure among the plurality of channel structures disposed immediately adjacent to at least one neighboring channel structure among the plurality of channel structures; and
  the plurality of channel structures comprising:
   an active channel structure disposed along a first longitudinal axis, and comprising:
    a channel region of the active channel structure;
    a first source/drain region disposed at a first end portion of the channel region; and
    a second drain/source region at a second end portion of the channel region; and
   an isolated neighboring dummy channel structure disposed immediately adjacent to the active channel structure, the isolated neighboring dummy channel structure comprising:
    a second channel structure having an outer surface and disposed along a second longitudinal axis substantially parallel to the first longitudinal axis; and
    a capping layer disposed on at least a portion of the outer surface of the second channel structure; and
 a gate disposed around at least a portion of the channel region of the active channel structure.

2. The IC of claim 1, wherein:
 the outer surface of the second channel structure comprising a top surface, a first side surface, and a second side surface, and
 the capping layer comprises:
  a top cap disposed on the top surface of the second channel structure; and
  side spacers disposed on the first and second side surfaces of the second channel structure.

3. The IC of claim 1, wherein the plurality of channel structures further comprises:
 a second neighboring channel structure disposed immediately adjacent to the active channel structure along a third longitudinal axis substantially parallel to the first longitudinal axis; and
 the gate disposed around at least a portion of the second neighboring dummy channel structure.

4. The IC of claim 3, wherein the second neighboring channel structure comprises an active second neighboring channel structure further comprising:
 a second channel region of the second neighboring channel structure;
 a third source/drain region disposed at a first end portion of the second channel region; and
 a fourth drain/source region at a second end portion of the second channel region.

5. The IC of claim 3, wherein the second neighboring channel structure further comprises a second neighboring dummy channel structure comprising a capping layer disposed on at least a portion of an outer surface of the second neighboring channel structure.

6. The IC of claim 1, wherein:
 the capping layer is configured to electrically isolate the isolated neighboring dummy channel structure from the IC.

7. The IC of claim 1, further comprising a Fin Field-Effect Transistor (FET) (FinFET) comprising:
 the channel region, the first source/drain region, and the second drain/source region of the active channel structure, among the plurality of channel structures; and
 the gate disposed around the portion of the channel region of the active channel structure.

8. The IC of claim 1, wherein:
 the gate is further disposed on the capping layer around at least a portion of the isolated neighboring dummy channel structure and substantially orthogonal to the second longitudinal axis.

9. The IC of claim 1, further comprising at least one metal interconnect disposed over the active channel structure and the isolated neighboring dummy channel structure, the isolated neighboring dummy channel structure electrically isolated from the metal interconnect by the capping layer.

10. The IC of claim 1, wherein the diffusion region is a first diffusion region comprising a semiconductor material having a first doping of an N-type or a P-type, the substrate further comprises a second diffusion region separated from the diffusion region by an isolation region of the substrate, the second diffusion region comprising a semiconductor material having a complement doping of an opposite type to the first doping, and the IC further comprises:
 a complement semiconductor channel structure array disposed above the substrate in the second diffusion region and comprising a plurality of complement channel structures spaced by a complement channel structure pitch;
  each complement channel structure among the plurality of complement channel structures disposed immediately adjacent to at least one neighboring complement channel structure among the plurality of complement channel structures;
  the plurality of complement channel structures comprising:
   a complement active channel structure disposed along a fourth longitudinal axis, and comprising:
    a complement channel region of the complement active channel structure;
    a first complement source/drain region disposed at a first end portion of the complement channel region; and
    a second complement source/drain region at a second end portion of the complement channel region; and
   a complement isolated neighboring dummy channel structure disposed immediately adjacent to the complement active channel structure, the complement isolated neighboring dummy channel structure comprising:

a second complement channel structure having an outer surface and disposed along a fifth longitudinal axis substantially parallel to the fourth longitudinal axis; and
a capping layer disposed on at least a portion of the outer surface of the second complement channel structure; and
the gate disposed around at least a portion of the complement channel region of the complement active channel structure.

11. The IC of claim 10, wherein the semiconductor material having the first doping is doped with a P-type material and the semiconductor material having the second doping is doped with an N-type material.

12. The IC of claim 10, wherein each complement channel structure of the plurality of complement channel structures comprises a semiconductor fin.

13. The IC of claim 10, wherein the plurality of complement channel structures further comprises:
a second complement neighboring channel structure disposed immediately adjacent to the complement active channel structure along a sixth longitudinal axis substantially parallel to the fourth longitudinal axis; and
the gate disposed around at least a portion of the second complement neighboring channel structure.

14. The IC of claim 13, wherein the second complement neighboring channel structure further comprising:
a second complement channel region of the second complement neighboring channel structure;
a third complement source/drain region disposed at a first end portion of the second complement channel region;
a fourth complement source/drain region at a second end portion of the second complement channel region.

15. The IC of claim 14, the second complement neighboring channel structure further comprising:
a capping layer disposed on at least a portion of an outer surface of the second complement neighboring channel structure.

16. The IC of claim 1, wherein each channel structure of the plurality of channel structures comprises a semiconductor fin.

17. The IC of claim 1 comprising a standard IC.

18. The IC of claim 1, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

19. A method of fabricating an integrated circuit (IC), comprising:
forming a semiconductor channel structure array in a diffusion region of a substrate, comprising:
forming a plurality of channel structures above the substrate and spaced by a channel structure pitch, each of the plurality of channel structures disposed immediately adjacent to at least one neighboring channel structure among the plurality of channel structures, comprising:
forming an active channel structure disposed along a first longitudinal axis, and a neighboring dummy channel structure immediately adjacent to the active channel structure along a second longitudinal axis substantially parallel to the first longitudinal axis;
forming a capping layer on an outer surface of the neighboring dummy channel structure to isolate the neighboring dummy channel structure;
forming a first source/drain region and a second drain/source region at first and second end portions, respectively, of a channel region in the active channel structure, the capping layer isolating the neighboring dummy channel structure from formation of a source or a drain in the neighboring dummy channel structure;
forming a gate over a channel region of each of the plurality of channel structures, including the channel region of the active channel structure.

20. The method of claim 19, wherein forming the plurality of channel structures comprises forming a plurality of semiconductor fins.

21. The method of claim 19, wherein forming the plurality of channel structures further comprises:
forming a second neighboring channel structure immediately adjacent to the active channel structure and along a third longitudinal axis substantially parallel to the first longitudinal axis.

22. The method of claim 21, wherein forming the capping layer further comprising forming the capping layer on an outer surface of the second neighboring channel structure.

23. The method of claim 21, wherein forming the first source/drain region and the second drain/source region further comprises:
forming a third source/drain region and a fourth drain/source region at first and second end portions, respectively, of a second channel region in the second neighboring channel structure.

24. The method of claim 19, wherein forming the capping layer on the outer surface of the neighboring dummy channel structure further comprises:
forming a top layer on a top surface of each of the plurality of channel structures;
forming side spacers on first and second side surfaces of each of the plurality of channel structures;
forming an oxide mask layer over the plurality of channel structures;
removing the oxide mask layer from the active channel structure;
removing the top layer and the side spacers from the active channel structure;
removing the oxide mask layer from the neighboring dummy channel structure; and
forming an insulating oxide layer on a surface of the substrate between and beside the plurality of channel structures.

25. The method of claim 19, wherein forming the gate further comprises:
forming a gate dielectric material over the channel region of each of the plurality of channel structures; and
forming a gate material over the gate dielectric material.

26. The method of claim 19, further comprising:
forming at least one metal interconnect over the active channel structure and the neighboring dummy channel structure, the neighboring dummy channel structure isolated from the at least one metal interconnect by the capping layer.

27. The method of claim 19, wherein forming the diffusion region in the substrate further comprises forming a first doped semiconductor region in the substrate, and the method further comprises:

forming a second diffusion region by forming a second doped semiconductor region in the substrate separated from the diffusion region by an isolation region in the substrate;

forming a complement semiconductor channel structure array in the second diffusion region, comprising:

forming a plurality of complement channel structures spaced by a complement channel structure pitch, each of the plurality of complement channel structures disposed immediately adjacent to at least one neighboring complement channel structure among the plurality of complement channel structures, comprising:

forming a complement active channel structure along a fourth longitudinal axis, and a complement neighboring dummy channel structure adjacent to the complement active channel structure and along a fifth longitudinal axis substantially parallel to the fourth longitudinal axis;

forming the capping layer on an outer surface of the complement neighboring dummy channel structure to isolate the complement neighboring dummy channel structure; and forming the gate over a channel region of each of the plurality of complement channel structures.

28. The method of claim 27, wherein the first doped semiconductor region is doped with a P-type material, and the second doped semiconductor region is doped with an N-type material.

* * * * *